(12) United States Patent
Miyadai

(10) Patent No.: US 10,056,906 B1
(45) Date of Patent: Aug. 21, 2018

(54) SHIFT OPERATION CIRCUIT AND SHIFT OPERATION METHOD

(71) Applicant: FUJITSU LIMITED, Kawasaki-shi, Kanagawa (JP)

(72) Inventor: Tomoharu Miyadai, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/877,765

(22) Filed: Jan. 23, 2018

(30) Foreign Application Priority Data

Feb. 6, 2017 (JP) ................................. 2017-019576

(51) Int. Cl.
*G06F 5/01* (2006.01)
*H03K 19/0175* (2006.01)

(52) U.S. Cl.
CPC ..... *H03K 19/017509* (2013.01); *G06F 5/015* (2013.01)

(58) Field of Classification Search
CPC ............ G06F 5/01; G06F 5/015; G11C 19/00
See application file for complete search history.

(56) References Cited

U.S. PATENT DOCUMENTS

| | | | | |
|---|---|---|---|---|
| 4,490,809 A * | 12/1984 | Ueda | ....................... | G06F 5/015 377/73 |
| 5,778,241 A | 7/1998 | Bindloss et al. | | |
| 6,810,475 B1 * | 10/2004 | Tardieux | ................... | G06F 5/01 712/217 |
| 2009/0013150 A1 | 1/2009 | Yamanaka | | |
| 2011/0004643 A1 * | 1/2011 | Tajiri | ....................... | G06F 5/015 708/209 |
| 2012/0254271 A1 * | 10/2012 | Kitamura | .................. | G06F 5/01 708/209 |
| 2013/0173994 A1 * | 7/2013 | Liu | .......................... | G06F 5/015 714/769 |
| 2015/0261498 A1 * | 9/2015 | Lutz | .......................... | G06F 5/01 708/209 |
| 2018/0067721 A1 * | 3/2018 | Lutz | ........................ | G06F 7/485 |

FOREIGN PATENT DOCUMENTS

| | | |
|---|---|---|
| JP | 08-050575 A | 2/1996 |
| JP | 2009-015555 A | 1/2009 |

* cited by examiner

*Primary Examiner* — Jason M Crawford
(74) *Attorney, Agent, or Firm* — Fujitsu Patent Center

(57) ABSTRACT

A shift operation circuit includes: shift circuits respectively coupled internal buses whose bit numbers partially overlap, each shift circuit receiving one of sets of divided data obtained by dividing input data and one of shift amount signals and outputting the corresponding divided data to a range shifted based on a shift amount represented by the corresponding shift amount signal from a reference bit position in the corresponding internal bus; a shift control circuit configured to output, during a first mode, shift amount signals whose shift amounts are common to the shift circuits, and configured to convert, during a second mode, a shift amount signal for each shift circuit, into a shift amount signal representing a shift range whose bit numbers do not overlap in the internal buses; and a bit selecting circuit configured to select valid divided data from bits whose bit numbers overlap in the internal buses.

6 Claims, 21 Drawing Sheets

FIG.5
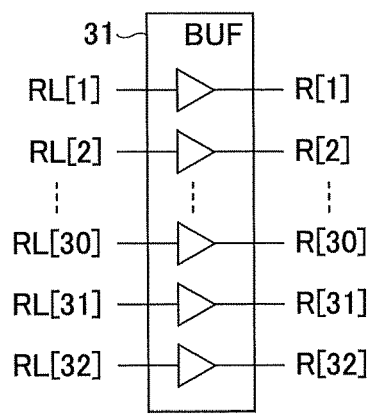
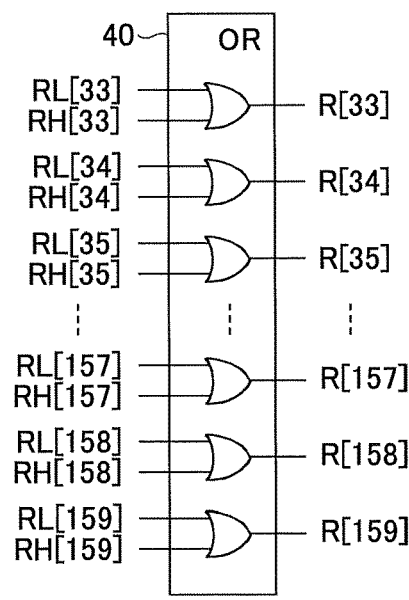
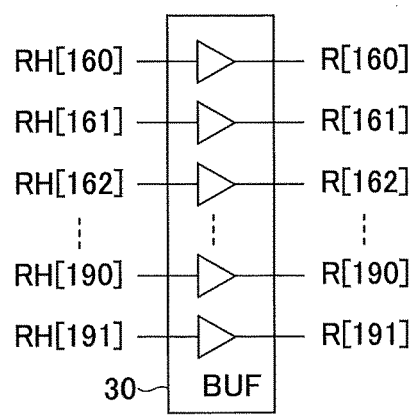

FIG.9

| | | RPL[0] | RP[0] |
|---|---|---|---|
| | | 0 | 0 |
| | | RL[1] | R[1] |
| | | RL[2] | R[2] |
| | | RL[3] | R[3] |
| | | RPL[1] | RP[1] |
| | | RL[4] | R[4] |
| | | RL[5] | R[5] |
| | | RL[6] | R[6] |
| | | RL[7] | R[7] |
| | ⋮ | ⋮ | ⋮ |
| | RPH[8] | RPL[8] | RP[8] |
| | 0 | RL[32] | R[32] |
| | RH[33] | RL[33] | R[33] |
| | RH[34] | RL[34] | R[34] |
| | RH[35] | RL[35] | R[35] |
| | ⋮ | ⋮ | ⋮ |
| | RPH[38] | RPL[38] | RP[38] |
| | RH[152] | RL[152] | R[152] |
| | RH[153] | RL[153] | R[153] |
| | RH[154] | RL[154] | R[154] |
| | RH[155] | RL[155] | R[155] |
| DP[0] | RPH[39] | RPL[39] | RP[39] |
| D[0] | RH[156] | RL[156] | R[156] |
| D[1] | RH[157] | RL[157] | R[157] |
| D[2] | RH[158] | RL[158] | R[158] |
| D[3] | RH[159] | RL[159] | R[159] |
| ⋮ | ⋮ | | ⋮ |
| DP[14] | RPH[46] | | RP[46] |
| D[56] | RH[184] | | R[184] |
| D[57] | RH[185] | | R[185] |
| D[58] | RH[186] | | R[186] |
| D[59] | RH[187] | | R[187] |
| DP[15] | RPH[47] | | RP[47] |
| D[60] | RH[188] | | R[188] |
| D[61] | RH[189] | | R[189] |
| D[62] | RH[190] | | R[190] |
| D[63] | RH[191] | | R[191] |
| D[63:0] (DP[15:0]) | RH[191:33] (RPH[47:8]) | RL[159:1] (RPL[39:0]) | R[191:1] (RP[47:0]) |

FIG.21

SHIFT OPERATION CIRCUIT AND SHIFT OPERATION METHOD

CROSS-REFERENCE TO RELATED APPLICATION

This application is based upon and claims the benefit of priority of the prior Japanese Patent Application No. 2017-019576 filed on Feb. 6, 2017, the entire contents of which are incorporated herein by reference.

FIELD

The embodiments discussed herein relate to a shift operation circuit and a shift operation method.

BACKGROUND

In recent years, a method called a Single Instruction Multiple Data (SIMD) operation is proposed for operating multiple sets of data in parallel based on a single instruction in order to efficiently process data that is used for image processing or the like by using a processor, such as a Central Processing Unit (CPU).

Such a Processor includes a plurality of arithmetic units, such as an adder, a logical unit, and a shifter, and causes the plurality of arithmetic units to operate in a coupled manner when an instruction indicates a scalar mode, and causes the plurality of arithmetic units to operate independently from each other when an instruction indicates a vector mode (for example, see Patent Document 1). Further, such a processor includes a pair of Arithmetic Logic Units (ALU) and a pair of shifters coupled to each other via a shift data selecting circuit. Then, in a mode for causing the ALUs to operate on a non-divided basis, the processor causes the shifters to operate in a coupled manner as well as causes the ALUs to operate in a coupled manner. In a mode for causing the ALUs to operate on divided basis, the processor causes the shifters to operate independently from each other as well as causes the ALUs to operate independently from each other (for example, see Patent Document 2).

RELATED-ART DOCUMENTS

Patent Documents

[Patent Document 1] Japanese Laid-Open Patent Publication No. H8-50575
[Patent Document 2] Japanese Laid-Open Patent Publication No. 2009-15555

Here, when a SIMD function is mounted on an arithmetic unit such as a floating-point adder, a function of each element of the arithmetic unit is switched between a case in which a normal instruction other than a SIMD instruction is executed and a case in which a SIMD instruction is executed. For example, in a floating-point adder or a floating-point multiplier/adder, a shift operation circuit for executing digit alignment of a significand includes a plurality of shift circuits that respectively shift a plurality of sets of data divided when executing a SIMD instruction. When bits of data supplied to a plurality of shift circuits overlap, the circuit scale of the shift circuits increases relative to a case in which bits do not overlap. However, a method for supplying data to a plurality of shift circuits without causing bits to overlap is not proposed.

SUMMARY

According to an aspect of the embodiments, a shift operation circuit includes: a plurality of shift circuits each of which is coupled to a corresponding internal bus that is one of a plurality of internal buses having a bit width greater than a bit width of input data, a part of bit numbers of the plurality of internal buses overlapping, each of the plurality of shift circuits being configured to receive corresponding divided data that is one of a plurality of sets of divided data obtained by dividing the input data and to receive a corresponding shift amount signal that is one of a plurality of shift amount signals, each of the plurality of shift circuits being configured to output the corresponding divided data to a range shifted based on a shift amount represented by the corresponding shift amount signal from a reference bit position in the corresponding internal bus; a shift control circuit configured to receive, during a first mode, each of plurality of shift amount signals whose shift amounts are common and to output, as the corresponding shift amount signal, the received plurality of shift amount signals to each of the plurality of shift circuits, and the shift control circuit being configured to receive, during a second mode, a shift amount signal for each of the plurality of shift circuits, convert the received shift amount signal into a corresponding shift amount signal that represents a shift range whose bit numbers do not overlap in the plurality of internal buses, and to output the corresponding shift amount signal to each of the plurality of shift circuits; and a bit selecting circuit configured to select valid corresponding divided data from bits whose bit numbers overlap in the plurality of internal buses and configured to output the selected corresponding divided data to an output bus.

According to another aspect of the embodiments, a shift operation method for a shift operation circuit including a plurality of shift circuits each of which is coupled to a corresponding internal bus that is one of a plurality of internal buses having a bit width greater than a bit width of input data, a part of bit numbers of the plurality of internal buses overlapping includes: receiving, by each of the plurality of shift circuits, corresponding divided data that is one of a plurality of sets of divided data obtained by dividing the input data; receiving, by each of the plurality of shift circuits, a corresponding shift amount signal that is one of a plurality of shift amount signals; outputting, by each of the plurality of shift circuits, the corresponding divided data to a range shifted based on a shift amount represented by the corresponding shift amount signal from a reference bit position in the corresponding internal bus; receiving, by a shift control circuit included in the shift operation circuit, during a first mode, each of a plurality of shift amount signals whose shift amounts are common and outputting, as the corresponding shift amount signal, the received plurality of shift amount signals to each of the plurality of shift circuits; receiving, by the shift control circuit, during a second mode, a shift amount signal for each of the plurality of shift circuits, converts the received shift amount signal into a corresponding shift amount signal that represents a shift range whose bit numbers do not overlap in the plurality of internal buses, and outputting the corresponding shift amount signal to each of the plurality of shift circuits; selecting, by a bit selecting circuit included in the shift operation circuit, valid corresponding divided data from bits whose bit numbers overlap in the plurality of internal buses; and outputting, the bit selecting circuit, the selected corresponding divided data to an output bus.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 5 is a diagram illustrating an example of buffer circuits and a bit selecting circuit, which are illustrated in FIG. 1;

FIG 9 is a diagram illustrating an example of allocation of data and parity bits in the shift operation circuit, which is illustrated in FIG. 8;

FIG. 21 is diagram illustrating an example of a shift operation of the shift operation circuit, which is illustrated in FIG. 16.

DESCRIPTION OF EMBODIMENT

In the following, embodiments will be described with reference to the accompanying drawings. It is an object in one aspect of the invention to reduce the circuit size of a shift operation circuit relative to a conventional one.

Figure 1:
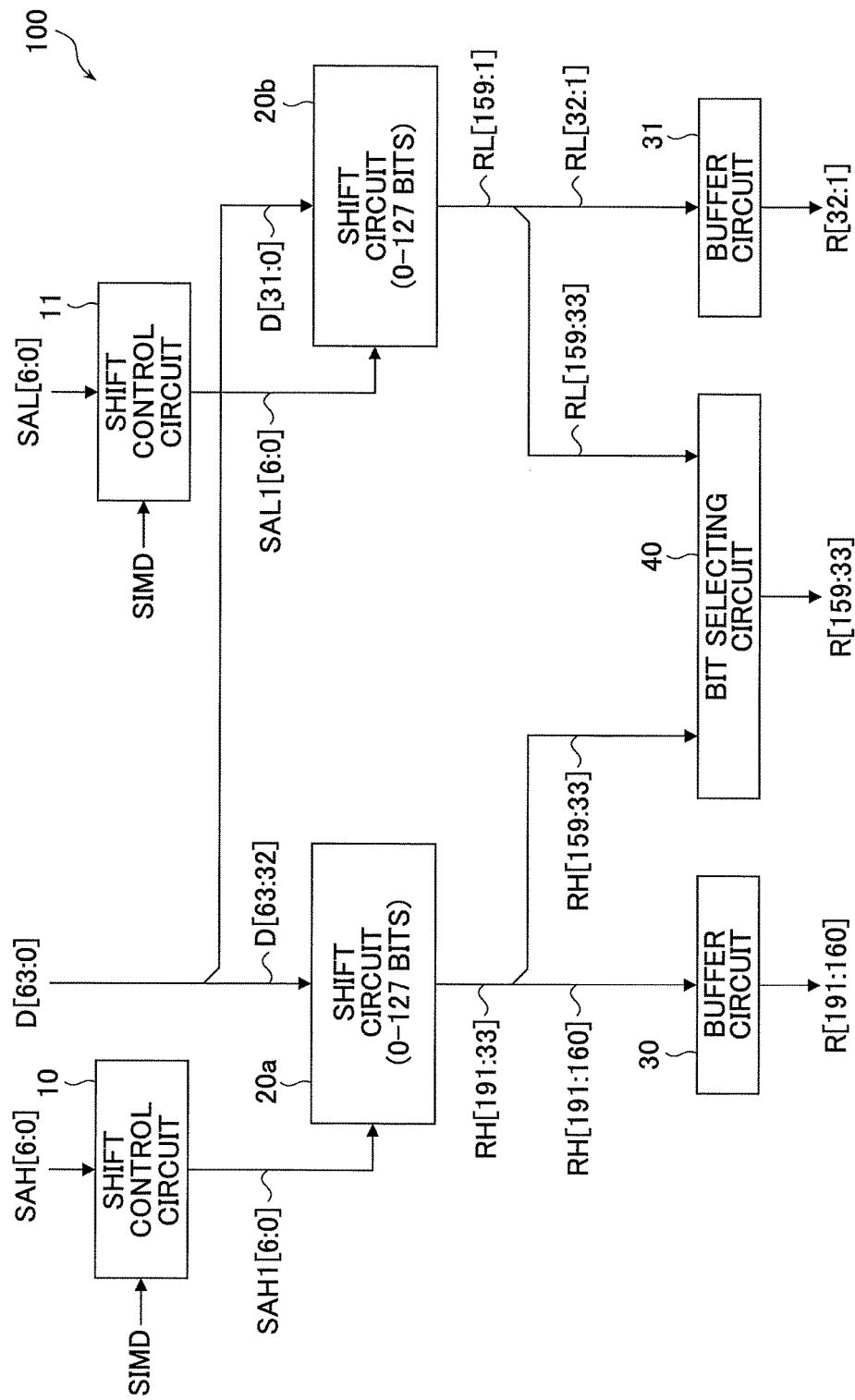
FIG. 1 is a diagram illustrating a shift operation circuit according to an embodiment.

FIG. 1 illustrates a shift operation circuit 100 according to a embodiment. The shift operation circuit 100 includes shift control circuits 10 and 11, shift circuits 20a and 20b, buffer circuits 30 and 31, and a bit selecting circuit 40.

The shift control circuit 10 receives a 7-bit shift amount signal SAH[6:0] that represents a shift amount the shift circuit 20a, and changes logical values of the shift amount signal SAH[6:0] in accordance with a mode signal SIMD, and outputs the changed signal as a shift amount signal SAH1[6:0]. Note that the mode signal SIMD is set to the logical value 1 during a SIMD mode in which an operation processing apparatus 200 executes a SIMD operation based on a SIMD instruction, and the mode signal SIMD is set to the logical value 0 during a normal mode in which the operation processing apparatus 200 executes a single operation based on a normal instruction. The normal mode is an example of a first mode, and the SIMD mode is an example of a second mode.

The shift control circuit 11 receives a 7-bit shift amount signal SAL[6.0] that represents a shift amount of the shift circuit 20b, and changes logical values of the shift amount signal SAL[6:0] in accordance with a mode signal SIMD, and outputs the changed signal as a shift amount signal SAL1[6:0]. Note that the shift control circuits 10 and 11 may be provided, on the shift operation circuit 100, as one shift control circuit. In the following, the shift amount signals SAH[6:0], SAL[6:0], SAH1[6:0], and SAL1[6:0] may also be referred to as the shift amount signals SAH, SAL, SAH1, and SAL1 by omitting the bit numbers.

In a case where the mode signal SIMD represents the normal mode, the shift amount signals SAH[6:0] and SAL [6:0] are set to values equal to each other. In a case where the mode signal SIMD represents SIMD mode, the shift amount signals SAH[6:0] and SAL[6:0] are set independently from each other.

Figure 4:
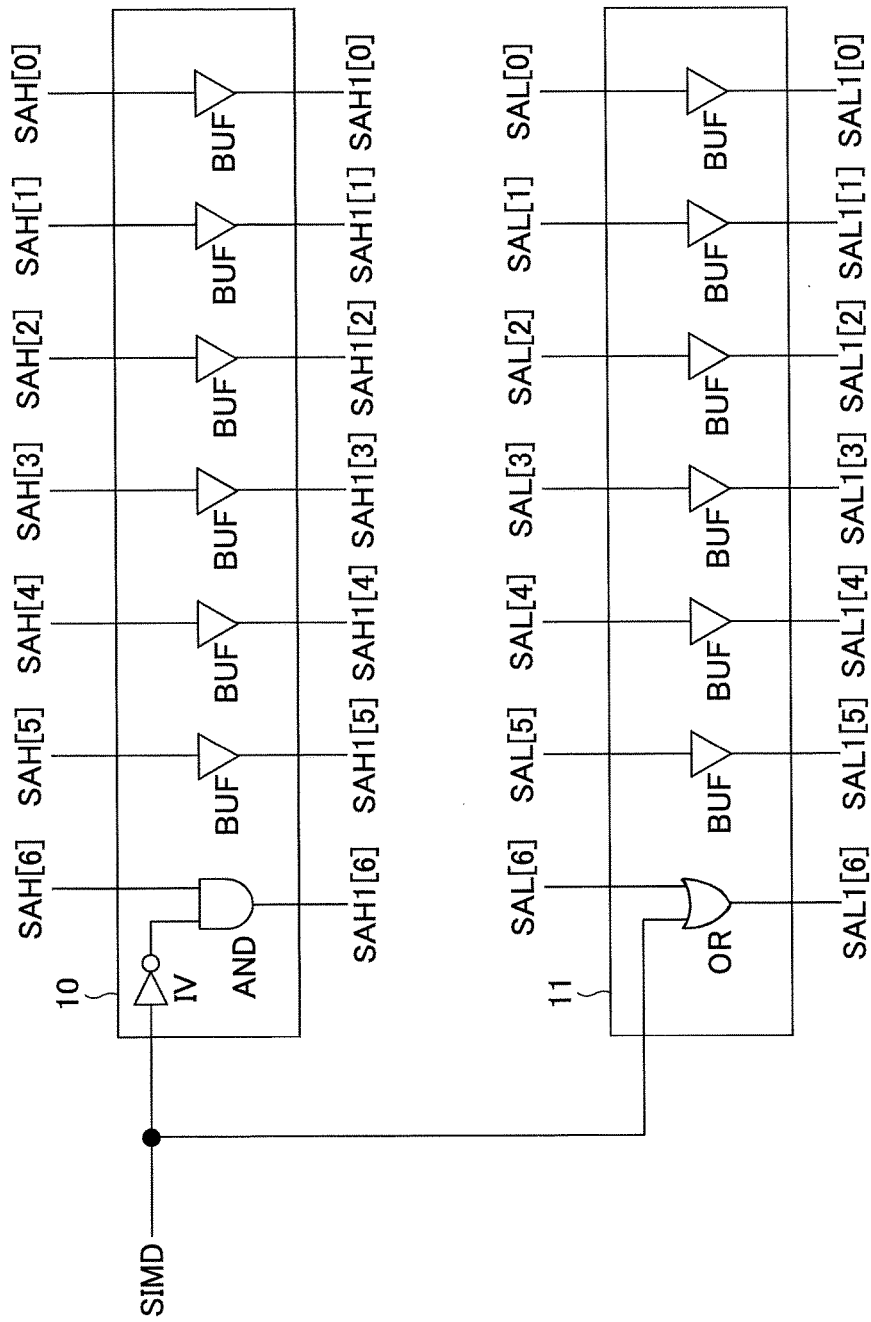
FIG. 4 is a diagram illustrating an example of shift control circuits, which are illustrated in FIG. 1.

For example, during the SIMD mode, the most significant bit SAH1[6] of the shift amount signal SAH1 is set to the logical value 0, and the most significant bit SAL1[6] of the shift amount signal SAL1 is set to the logical value 1. The shift amount signal SAH1, of which the most significant bit SAH1[6] is set to the logical value 0, represents one of to "0" to "63", and the shift amount signal SAL1, of which the most significant bit SAL1[6] is set to the logical value 1, represents one of "64" to "127". In other words, during the SIMD mode, the shift amount signals SAH [6:0] and SAL [6:0] are converted, at the internal buses RH[191:33] and RL[159:1], into shift amount signals SAH1[6:0] and SAL1 [6:0] that represent shift ranges of which the bit numbers do not overlap. An example of the shift control circuits 10 and 11 are illustrated in FIG. 4.

The shift circuit 20a receives 32-bit divided data D[63:32] obtained by dividing 64-bit input data D[63:0] and receives the shift amount signal SAH1[6:0]. The shift circuit 20a outputs, in the internal bus RH[191:33], the divided data D[63:32] to a range shifted from a reference bit position RH[191] by the shift amount represented by the shift amount signal SAH1[6:0]. In the following, the input data D[63:0] may also be referred to as the data D[63:0], and the divided data D[63:32] may also be referred to as the data D[63:32]. Further, the data transmitted to the internal bus RH[191:33] may be also referred to as the data RH[191:33]. In other words, each of the shift circuits 20a and 20b may receive the corresponding divided data, which is one of a plurality of sets of divided data obtained by dividing input data D[63:0], and receive the corresponding shift amount signal, which is one of a plurality of shift amount signals, and each of the shift circuits 20a and 20b may output the corresponding divided data to a range shifted by based on shift amount represented by the corresponding shift amount signal from a reference bit position in the corresponding internal bus.

The shift circuit 20a shifts, in accordance with the value of the shift amount signal SAH1, the bits of the data D[63:32] from the high-order side to the low-order side, and outputs the shifted data as 159-bit data RH[191:33]. That is, the shift circuit 20a shifts the data D[63:32] to the right by the value of the shift amount signal SAH1 (which is a value from 0 bits to 127 bits). The shift circuit 20a includes a function to set 127 bits to the logical value 0 except for 32 bits output as the data D[63:32], within the 159-bit data RH[191:33].

The shift circuit 20b receives 32-bit divided data D[31:0] obtained by dividing the 64-bit input data D[63:0] and receives the shift amount signal SAL1[6:0]. The shift circuit 20b outputs, in the internal bus RL[159:1], the divided data D[31:0] to a range shifted from reference bit position RL[159] by the shift amount represented by the shift amount signal SAL1[6:0]. In the following, the divided date D[31:0] may also be referred to as the data D[31:0], and the data transmitted to the internal bus RL[159:1] may be also referred to as the data RL[159:1].

The shift circuit 20b shifts, in accordance with the value of the shift amount signal SAL1, the bits of the data D[31:0] from the high-order side to the low-order side, and outputs the shifted data as 159-bit data RH[159:1]. That is, the shift-circuit 20b shifts the data D[31:0] to the right by the value of the shift amount signal SAL1 (which is a value from 0 bits to 127 bits The shift circuit 20b includes a function to set 127 bits to the logical value 0 except for 32 bits output as the data D[31:0] within the 159-bit data RL[159:1].

The bit numbers of the bits RH[159:33] of the internal bus RH[191:33] coupled to the shift circuit 20a and the bit numbers of the bits RL[159:33] of the internal bus RL[159:1] coupled to the shift circuit 20b overlap with each other. In other words, a part of the bit numbers of the internal buses RH[191:33] and RL[159:1] overlap. Conversely, the reference bit position RL[159] in the shift circuit 20b is allocated by shifting the bit width of the divided data D[63:32] with respect to the reference bit position RH[191] in the shift circuit 20a. Thereby, as described in the following with reference to FIG. 6, in the normal mode, the divided data D[63:32] and D[31:0] supplied to the shift circuits 20a and 20b, which are different from each other, can be output, as continuous data D[63:0], to the output bus R[191:1]. In the following, the data transmitted to the output bus R[191:1] may be also referred to as the data R[191:1].

The shift circuits 20a and 20b are circuits equal to each other and have common circuit data (macro data). Hence, for example, design data of the shift circuit 20a can be used in the shift circuit 20b. Therefore, it is possible to reduce a designing period of the shift circuits 20a and 20b relative to a case of independently designing the shift circuits 20a and 20b.

The buffer circuit 30 outputs, as data R[191:160], the high-order 32-bit data RH[191:160] within the data RH[191:33] output from the shift circuit 20a. That is, the buffer circuit 30 outputs, to the output bus [191:160], the data RH[191:160] output by the bits RH[191:160] whose bit numbers do not overlap with the internal bus RL[159:1] in the internal bus RH[191:331].

The buffer circuit 31 outputs, as data R[32:1], the low-order 32-bit data RL[32:1] within the data RL[159:1] output from the shift circuit 20b. The buffer circuit 31 outputs, to the output bus [32:1], the data RL[32:1] output by the bits RL[32:1] whose bit numbers do not overlap with the internal bus RH[191:33] in the internal bus RL[159:1].

The bit selecting circuit 40 selects valid bits from the data RH[159:33], output from the shift circuit 20a, and the data RL[159:33], output from the shift circuit 20b, and outputs the selected bits to the output bus R[159:33]. Within the data R[159:33], the valid bits are 32 bits at a minimum and 64 bits at a maximum. In the following, the data D[63:0], RH[191:33], RL[159:1], and R[191:1] may also be referred to as the data D, RH, RL, and R by omitting the bit numbers.

Figure 6:
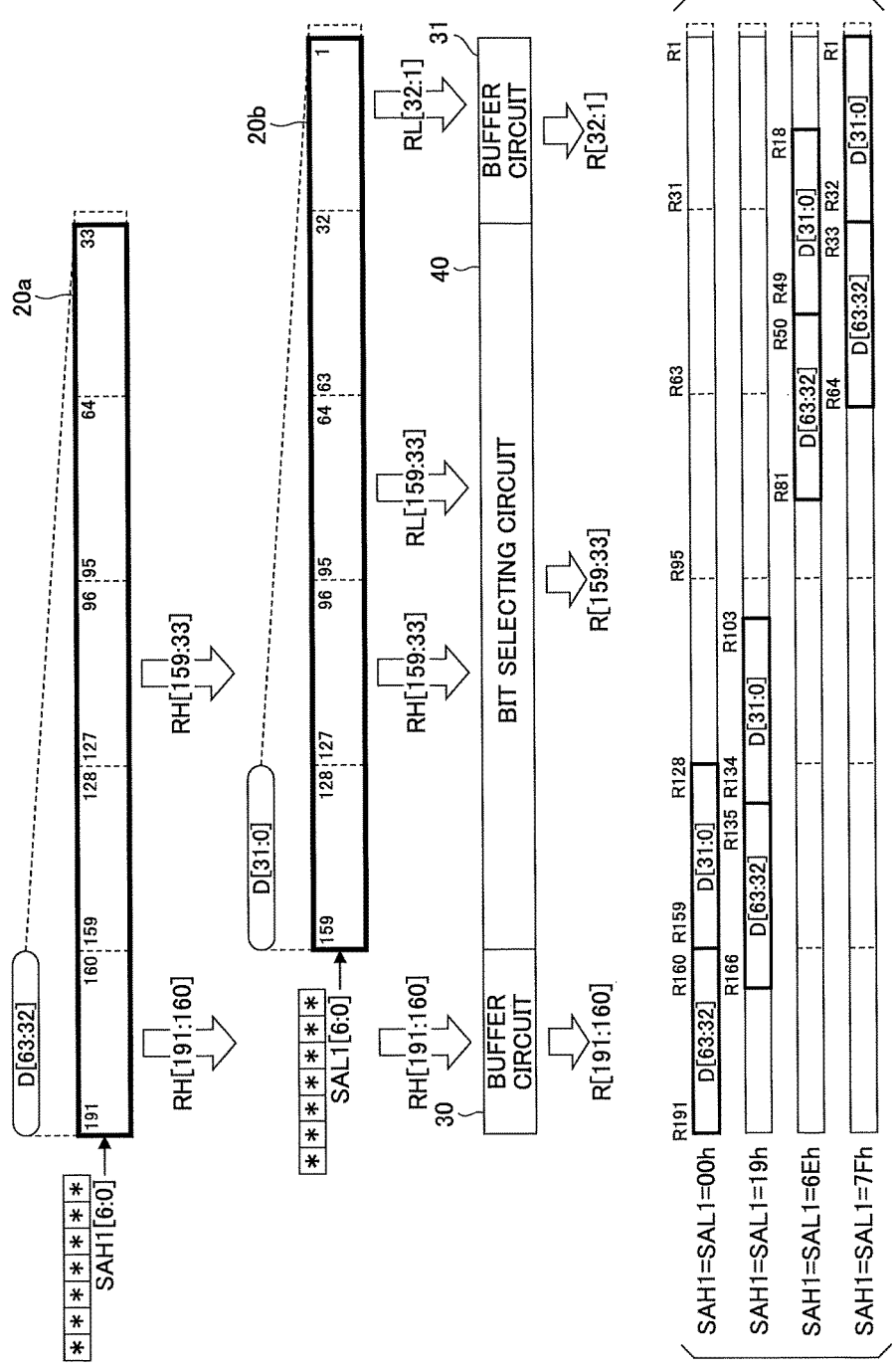
FIG. 6 is a diagram illustrating an example of an operation in a normal mode of the shift operation circuit, which is illustrated in FIG. 1.
Figure 7:
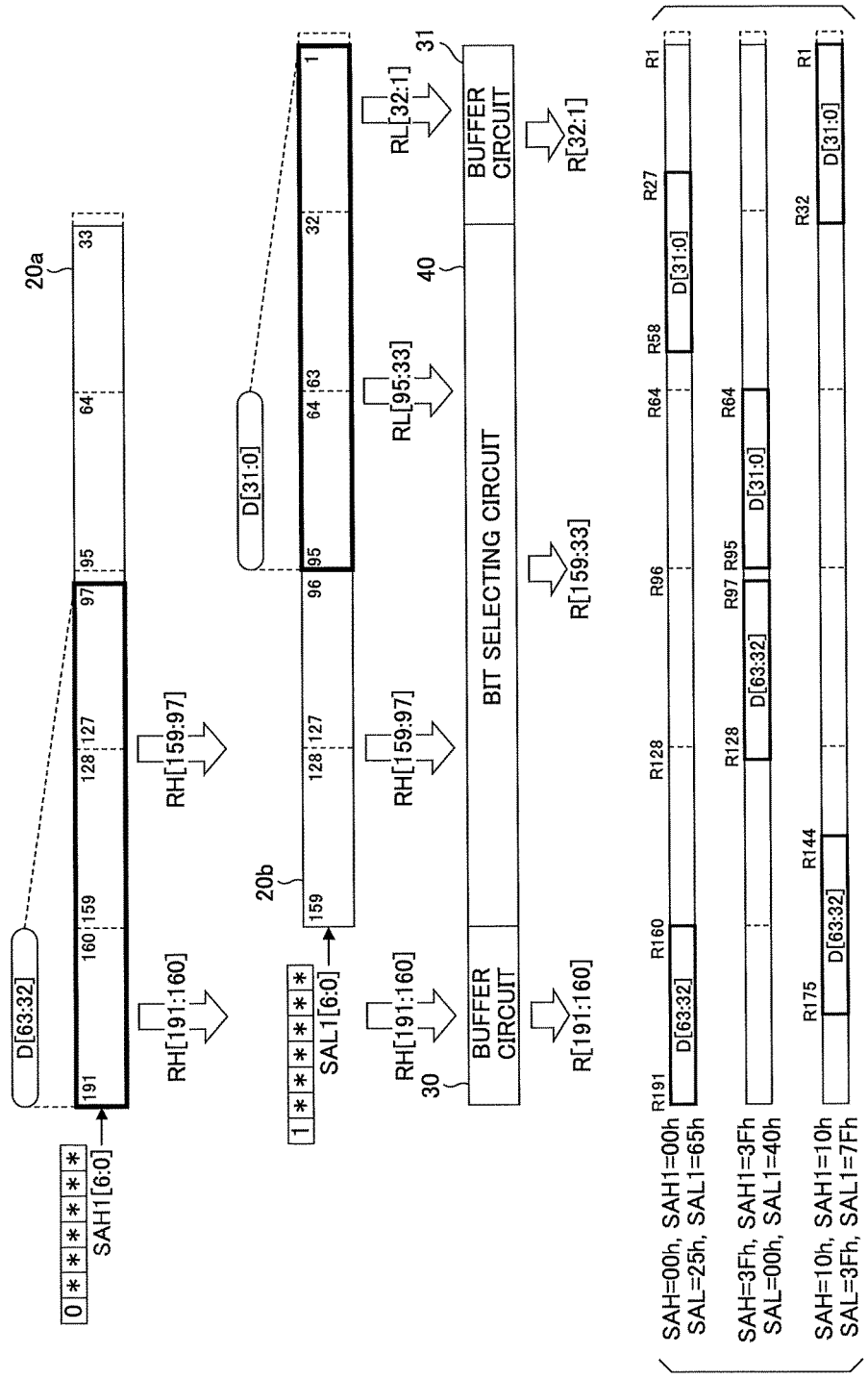
FIG. 7 is a diagram illustrating an example an operation in a SIMD mode of the shift operation circuit, which is illustrated in FIG. 1.

During the normal mode, the shift operation circuit 100 shifts the input data D[63:0] to the right by the value of the shift amount signals SAH and SAL (the same logical value), and outputs the shifted data as any 64 bits of the data R[191:1]. In contrast, during the SIMD mode, the shift operation circuit 100 shifts the input data D[63:32] to the right by the value of the shift amount signal SAH and outputs the shifted data as any 32 bits of the data R[191:95]. Further, during the SIMD mode, the shift operation circuit 100 shifts the input data D[31:0] to the right by the value of the shift amount signal SAL and outputs the shifted data as any 32 bits of the data R[95:1]. An example of the operation of the shift operation circuit 100 in the normal mode is illustrated in FIG. 6, and an example of the operation of the shift operation circuit 100 in the SIMD mode is illustrated in FIG. 7.

Figure 2:
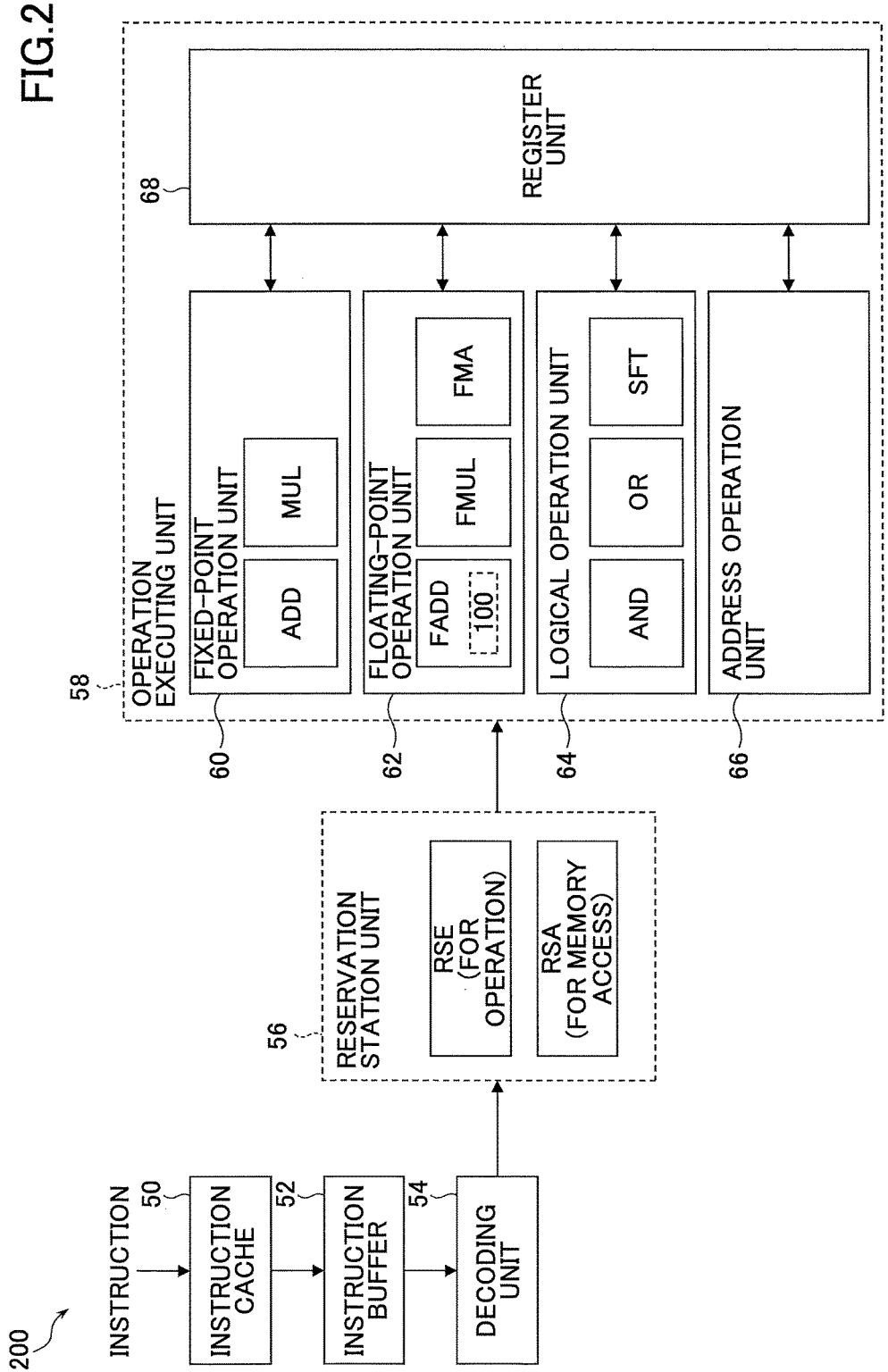
FIG. 2 is a diagram illustrating an example of an operation processing apparatus on which the shift operation circuit that is illustrated in FIG. 1 is mounted.

FIG. 2 illustrates an example of the operation processing apparatus 200 on which the shift operation circuit 100 that is illustrated in FIG. 1 is mounted. The operation processing apparatus 200 includes an instruction cache 50, a instruction buffer 52, a decoding unit 54, a reservation station unit 56, and an operation executing unit 58. The operation processing apparatus 200 may be a processor such as a CPU, and FIG. 2 illustrates a part of a processor core mounted on the processor.

For example, the instruction cache 50 is a secondary cache (second level cache) or a primary instruction cache (first level cache) that stores an instruction transmitted from a main memory or the like. The instruction buffer 52 sequentially holds an instruction transmitted from the instruction cache and sequentially outputs, to the decoding unit 54, the held instruction. The decoding unit 54 decodes the instruction transmitted from the instruction buffer 52, and inputs, in the reservation station unit 56, an instruction code, a register number, and the like included in the decoded instruction.

The reservation station unit 56 includes a Reservation Station for Execution (RSE) including a plurality of entries that hold operation instructions. Further, the reservation station unit 56 includes a Reservation Station for Address (RSA) including a plurality of entries that hold memory access instructions such as a load instruction and a store instruction.

The Reservation Station for Execution (RSE) determines a dependence relationship between the operation instructions held in the entries, and selects, based on the determined dependence relationship, an executable operation instruction from the operation instructions held in the entries. The Reservation Station for Execution (RSE) inputs the selected operation instruction into the operation executing unit 58. The Reservation Station for Address (RSA) determines a dependence relationship between the memory access instructions held in the entries, and selects, based on the determined dependence relationship, an executable load instruction or store instruction from the memory access instructions held in the entries. The Reservation Station for Address (RSA) inputs the selected load instruction or store instruction into the operation executing unit 58.

The operation executing unit 58 includes a fixed-point operation unit 60, a floating-point operation unit 62, a logical operation unit 64, an address operation unit 66, and a register unit 68. The fixed-point operation unit 60 includes an adder ADD that executes addition or subtraction of fixed-point numbers and a multiplier MUL that executes multiplication or division of fixed-point numbers. The floating-point operation unit 62 includes an adder FADD that executes addition or subtraction of floating-point numbers and a multiplier FMUL that executes multiplication or division of floating-point numbers. Further, the floating-point operation unit 62 includes a multiplier/adder FMA that executes multiplication and addition of floating-point numbers. The shift operation circuit 100 that is illustrated in FIG. 1 is mounted on adder FADD for floating-point numbers. Note that the shift operation circuit 100 may be mounted on the multiplier/adder FMA for floating-point numbers.

For example, the adder FADD, the multiplier FMUL, and the multiplier/adder FMA include a function to execute a SIMD operation. In the SIMD operation, because a plurality of operations are executed in parallel based on a single instruction, a plurality of sets of data are respectively stored in a first operand and a second operand of a SIMD instruction in a divided manner.

The logical operation unit 64 includes logical conjunction operator AND that executes an AND logical operation, and a logical disjunction operator OR that executes an OR logical operation, and a shift operator that executes a shift operation. The address operation unit 66 calculates an access address based on a memory access instruction input from the reservation station RSA and outputs the calculated access address to data cache or the like not illustrated.

The register unit 68 has a plurality of universal registers designated by an instruction and a plurality of registers (update buffers) that temporarily hold operation results and the like. For example, each register is 64 bits.

Figure 3:
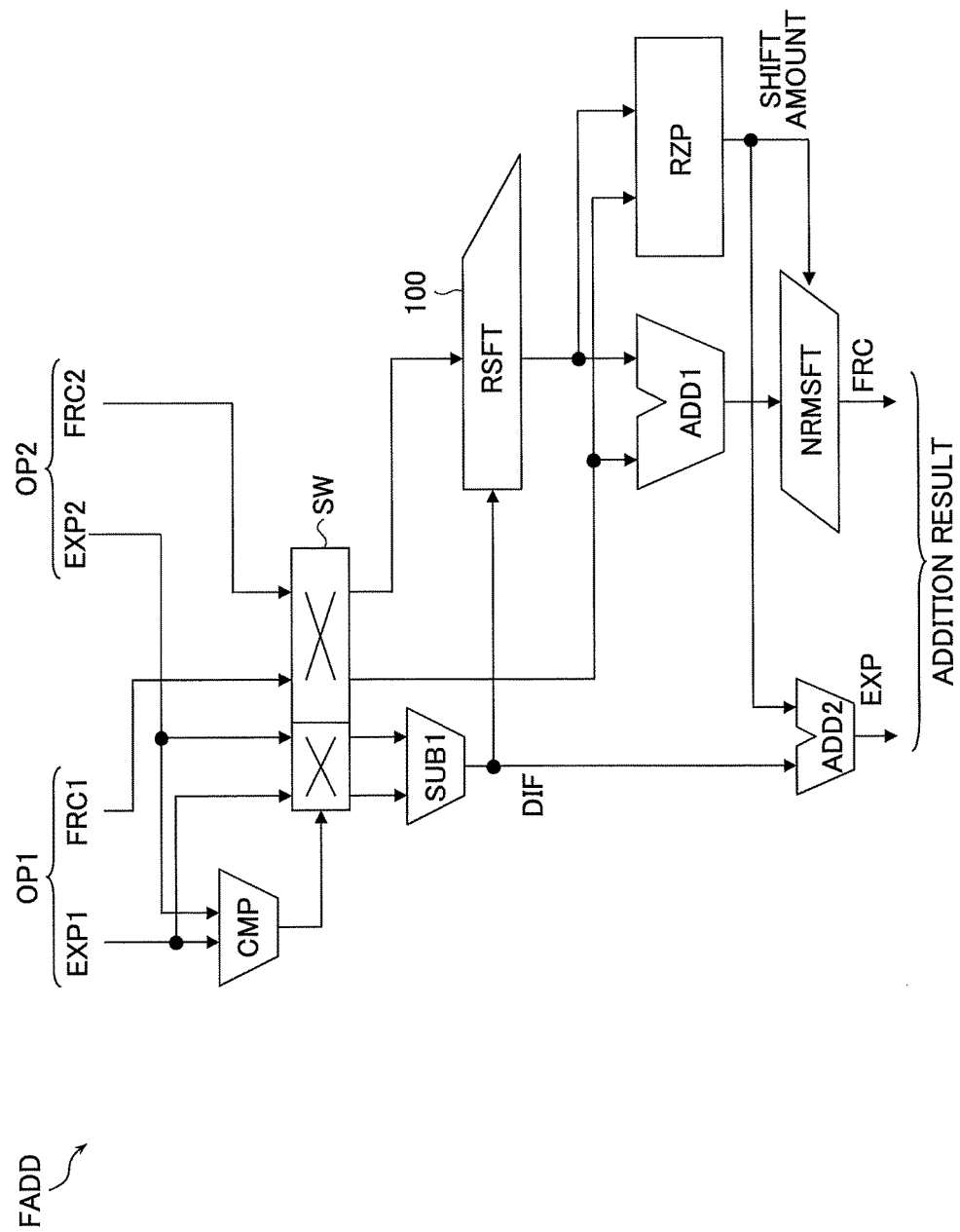
FIG. 3 is a diagram illustrating an example of a floating-point adder that is illustrated in FIG. 2.

FIG. 3 illustrates an example of the floating-point adder FADD, which is illustrated in FIG. 2. The floating-point adder FADD includes a comparator CMP, a switch SW, a subtractor SUB 1, a right shifter RSFT, an adder ADD 1, a leading zero predictor RZP, a normalization shifter NRMSFT, and an adder ADD 2. For example, the shift operation circuit 100, which is illustrated in FIG. 1, may be mounted as the right shifter RSFT on the adder FADD for floating-point numbers.

In the following, an operation of the floating-point adder FADD in a normal mode will be described. The floating-point adder FADD, which is illustrated in FIG. 3, adds a 64-bit operand OP1, which includes an exponent EXP1 and a significand FRC1, and a 64-bit operand OP2, which includes an exponent EXP2 and a significand FRC2, and outputs the exponent EXP and the significand FRC that indicate the addition result. The operands OP1 and OP2 and the addition result are held in universal registers of the register unit 68, which is illustrated in FIG. 2.

For example, in The IEEE (Institute of Electrical and Electronics Engineers) 754 (Standard for Floating-point Arithmetic), a 64-bit floating number has a 1-bit sign part, a 11-bit exponent part, and a 52-bit significand part. In FIG. 2, the sign bit part (sign bit) is omitted. Further, in the IEEE754, the normalized most significant bit is omitted as a hidden bit in a floating point number, but the output of the switch SW is supplemented with the hidden bit.

The comparator CMP compares the magnitude of the exponent EXP1 with the magnitude of the exponent EXP2. When the exponent EXP2 is larger than the exponent EXP1, the comparator CMP outputs, to the switch SW, a switch control signal SWC for switching the exponents EXP1 and EXP2. When the exponent EXP1 is equal to or larger than the exponent EXP2, the comparator CMP outputs, to the switch SW, a switch control signal SWC for not switching the exponents EXP1 and EXP2. The subtractor SUB1 obtains a difference between the exponents EXP1 and EXP2 output from the switch SW and outputs, to the right shifter RSFT and the adder ADD2, a difference signal DIF that represents the obtained difference. Here, in a normal mode, the value of the difference signal DIF is supplied, to the right shifter RSFT, as shift amount signals SAR[6:0] and SAL[6:0] that are illustrated in FIG. 1.

The right shifter RSFT shifts the significand (one of FRC1 or FRC2) having a smaller value out of the operands OP1 and OP2 to the right by the value of the differential signal DIF and outputs it to the adder ADD1 and the leading zero predictor RZP. The significand supplied from the switch SW to the right shifter RSFT is included in data D[63:0] that is illustrated in FIG. 1. By the operation of the right shifter RSFT, one digit of the significand FRC1 or FRC2 is matched to that of the other of the significand FRC1 or FRC2, and the significands FRC1 and FRC2 whose digits are matched are added by the adder ADD1. Note that in order to execute a SIMD operation, the right shifter RSFT (that is, the shift operation circuit 100) includes the shift circuits 20a and 20b that shift data D[63:32] and D[31:0] independently, as illustrated in FIG. 1. An example of the operation of the shift operation circuit 100 in the SIMD mode for executing the SIMD operation is illustrated in FIG. 7.

The adder ADD1 adds the digit-matched significands FRC1 and FRC2, and outputs the addition result to the normalization shifter NRMSFT. Using the digit-matched significands FRC1 and FRC2, the leading zero predictor RZP predicts the number of "0"s until the first "1" appears in the high-order bit side in the addition result by the adder ADD1. Then, the leading zero predictor RZP outputs, to the normalization shifter NSFT and the adder ADD2, the predicted number as a shift amount.

The normalization shifter NRMSFT bit-shifts, based on the shift amount predicted by the leading zero predictor RZR, the addition result (significand) by the adder ADD1, and thereby sets "1", which first appears on the high-order bit side of the addition result, to a hidden bit. Then, the normalization shifter NRMSFT outputs a significand FRC having the correct hidden bit. The adder ADD2 adds the value of the difference signal DIF from the subtractor SUB1 and the value of the shift amount, and outputs the addition result as an exponent EXP.

Note that during the SIMD mode, the floating-point adder FADD adds 32-bit floating-point numbers included in the respective operands OP1 and OP2 to each other, and also adds other 32-bit floating-point numbers included in the respective operands OP1 and OP2 to each other. That is, the operation processing apparatus 200 has an SIMD operation function to independently add two pairs of floating-point data included in the operands OP1 and OP2. During the SIMD mode, each element of the floating-point adder FADD is switched to the function of adding two pairs of floating-point data, but the details of the circuit are omitted. Note that in a case where the shift operation circuit 100 is mounted in the multiplier/adder FMA illustrated in FIG. 2, the shift operation circuit 100 also mounted as a right shifter RSFT in the adder of the multiplier/adder FMA similarly to FIG. 3.

FIG. 4 illustrates an example of the shift control circuits 10 and 11, which are illustrated in FIG. 1. The shift control circuit 10 includes an and-circuit AND that receives a mode signal SIMD via an inverter IV, and the shift control circuit 10 includes a plurality of buffers BUF that output a shift amount signal SAH[5:0] as a shift amount signal SAH1[5:0]. During the normal mode (SIMD="0"), the and-circuit AND outputs the most significant bit SAH[6] of the shift amount signal SAH as the shift amount signal SAH1[6]. During the SIMD mode (SIMD="1"), the and-circuit AND sets the shift amount signal SAH1[6] to "0". That is, during the SIMD mode, the shift control circuit 10 outputs, in accordance with the shift amount signal SAH[5:0], the shift amount signal SAH1[6:0] that represents a shift amount of from 0 bits to 63 bits.

The shift control circuit 11 includes an or-circuit OR that receives the mode signal SIMD, and the shift control circuit 11 includes a plurality of buffers BUF that output a shift amount signal SAL[5:0] as a shift amount signal SAL1[5:0]. During the normal mode, the or-circuit _OR outputs the most significant bit SAL[6] of the shift amount signal SAL as the shift amount signal SAL1[6] to "0". During the SIMD mode (SIMD="1"), the or-circuit _OR sets the shift amount signal SAL1[6] to "0". That, is during the SIMD mode, the shift control circuit 11 outputs, in accordance with the shift amount signal SAL[5:0], the shift amount signal SAL1[6:0] that represents a shift amount of from 64 bits to 127 bits.

The most significant bits SAH1[6] and SAL1[6] of the respective shift amount signals SAH1[6:0] and SAL1[6:0] output to the shift circuits 20a and 20b are set, by the and-circuit AND and the or-circuit OR, to logical values different from each other. Thus, as will be described with reference to FIG. 7, even when the shift amount signal SAH[6:0] and the shift amount signal SAL[6:0] are set independently from each other in the SIMD mode, it is possible to prevent the data D[63:32] and the data D[31:0] from collision.

FIG. 5 illustrates an example of the buffer circuits 30 and 31 and the bit selecting circuit 40, which are illustrated in FIG. 1. The buffer circuit 30 includes a plurality of buffers BUF that output data RH[191:160] as data R[191:160]. The buffer circuit 31 includes a plurality of buffers BUF that output data RL[32:1] as data R[32:1].

The bit selecting circuit 40 includes a plurality of or-circuits OR that output, as data R, an or-logic of each bit of 127-bit data RH[159:33] and RL[159:33] of which the bit numbers overlap with each other. That is, for each bit of the data R[159:33], the logical value 1 is set in a case where either the respective bit of the data RH[159:33] or the respective bit of data RL[159:33] is the logical value 1.

The shift circuit 20a includes a function, at the internal bus RH, to set 127 bits to the logical value 0 except for 32 valid bits output as the date D[63:32]. The shift circuit 20b includes a function, at the internal bus RL, to set 127 bits to the logical value 0 except for 32 valid bits output as the data D[31:0]. Further, as illustrated in FIG. 6 and FIG. 7, valid data D is not simultaneously output by data RH and RL having same bit numbers among the data RH[159:33] and RL[159:33]. Hence, the logical value 0 is necessarily supplied to one of two input units of each or-circuit OR of the bit selecting circuit 40. Therefore, by receiving, through the or-circuits OR, the respective bits of the data RH[159:33] and RL[159:33] of which the bit numbers overlap with each other, the bit selecting circuit 40 can select valid data and output the selected data to the output bus R[158:33] without using a control signal.

FIG. 6 illustrates an example of an operation in the normal mode (SIMD"0") of the shift operation circuit 100, which is illustrated in FIG. 1. That is, FIG. 6 illustrates an example of shift operation method by the shift operation circuit 100. In FIG. 6, 7-bit "*", which indicates the shift amount signals SAH1[6:0] and SAL1[6:0], indicates that the value of each bit is set to "0" or "1".

With reference to the bit RH[191], the shift circuit 20a shifts, in accordance with the shift amount signal SAH1[6:0], the position of each bit of the data D[63:32] in a range of from 0 bits to 127 bits, and outputs e shifted data as the data RH[191:33]. With reference to the bit RL[159], the shift circuit 20b shifts, in accordance with the shift amount signal SAL1 [6:0], the position of each bit of the data D[31:0] in a range of from 0 bits to 127 bits, and outputs the shifted data as the data RL[159:1].

The bits used as the references by the shift circuits 20a and 20b differ by 32 bits. Therefore, the bit range of the data RH that is output by the shift circuit 20a and the bit range of the data RL that is output by the shift circuit 20b differ by 32 bits. Further, in the normal mode, the value of the shift amount signal SAH1[6:0] and the value of the shift amount signal SAL1[6:0] are equal to each other. Hence, in a shift operation of the data D[63:0], the shift operation circuit 100 can output the data D[63:32] and D[31:0] as the data R without causing the bit numbers of the data RH and the data RL to overlap. That is, it is possible to prevent the data D[63:32] and D[31:0] from collision. Further, the shift operation circuit 100 can output the data D[63:0] as the unified 64-bit data R without blank bit numbers in the data RH and the data RL.

The output bus R[191:1] illustrated within brackets at the lower part FIG. 6 indicates an example of bit positions at which data D[63:0] appears in accordance with the shift amount signals SAH1 and SAL1. The sign "h" the end of the numerical value of the shift amount signals SAH1 and SAL1 indicates that the numerical value is a hex number. Note that the value of the shift amount signal SAH1 is the same as the value of the shift amount signal SAH supplied to the shift operation circuit 100, and the value of the shift amount signal SAL1 is the same as the value of the shift amount signal SAL supplied to the shift operation circuit 100.

In a case where the shift amount signals SAH1 and SAL1 are "00h" (right shift by 0 bits), the data D[63:32] is output as data R[191:160], and the data D[31:0] is output as data R[159:128]. The shift circuit 20a sets each bit of the data RH[159:33], where the data D[63:32] does not appear, to "0". The shift circuit 20b sets each bit of the data RL[127:1], where the data D[31:0] does not appear, to "0". Hence, the bit selecting circuit 40 sets each bit of the data R[128:33] to "0". The buffer circuit 31 sets each bit of the data R[32:1] to "0".

In a case where the shift amount signals SAH1 and SAL1 are "19 h" (right shift by 25 bits), the data D[63:32] is output as data R[166:135], and the data D[31:0] output as data R[134:103]. The shift circuit 20a sets each bit of the data RH[191:167] and RH[134:33], where the data D[63:32] does not appears, to "0". The shift circuit 20b sets each bit of the data RL[159:135] and RL[102:1], where the data D[31:0] does not appear, to "0". Hence, the buffer circuit 30 sets each bit of the data R[191:167] to "0". The bit selecting circuit 40 sets each bit of the data R[102:33] to "0". The buffer circuit 31 sets each bit of the data R[32:1] to "0".

In a case where the shift amount signals SAH1 and SAL1 are "6 Eh" (right shift by 110 bits), the data D[63:32] is output as data R[81:50], and the data D[31:0] is output as data R[49:18]. The shift circuit 20a sets each bit of the data RH[191:021] and RH[49:33], where the data D[63:32] does not appear, to "0". The shift circuit 20b sets each bit of the data RL[159:50] and RL[17:1], where the data D[31:0] does not appear, to "0". Hence, the buffer circuit 30 sets each bit of the data R[191:160] to "0". The bit selecting circuit 40 sets each bit of the data R[159:82] to "0". The buffer circuit 31 sets each bit of the data R[17:1] to "0".

In a case where the shift amount signals SAH1 and SAL1 are "7 Fh" (right shift by 127 bits), the data D[63:32] is output as data R[64:33], and the data D[31:0] is output as data R[32:1]. The shift circuit 20a sets each bit of the data RH[191:64], where the data D[63:32] does not appear, to "0". The shift circuit 20b sets each bit of the data RL[159:33], where the data D[31:0] does not appear, to "0". Hence, the buffer circuit 30 sets each bit of the data R[191:160] to "0". The bit selecting circuit 40 sets each bit of the data R[159:65] to "0".

FIG. 7 illustrates an example of an operation in the SIMD mode (SIMD="1") of the shift operation circuit 100, which is illustrated in FIG. 1. That is, FIG. 7 illustrates another example of the shift operation method by the shift operation circuit 100. Detailed descriptions for an operation of FIG. 7 similar to that of FIG. 6 are omitted as appropriate. Note that in the SIMD mode, the shift amount signal SAH1[6:0] and the shift amount signal SAL1[6:0], illustrated in FIG. 1, are set independently from each other.

In the SIMD mode, the most significant bit SAH1[6] of the shift amount signal SAH1 is fixed to "0", and the most significant bit SAL1[6] of the shift amount signal SAL1 is fixed to "1". That is, in the SIMD mode, a predetermined number of bits of the shift amount signals SAH1 and SAL1 are set to logical values different from each other. Thus, with reference to the bit RH[191], the shift circuit 20a shifts, in accordance with the shift amount signal SAH1[6:0], the position of each bit of the data D[63:32] in a range of from 0 bits to 63 bits, and outputs the shifted data as the data RH[191:97]. With reference to the bit RL[159], the shift circuit 20b shifts, in accordance with the shift amount signal SAL1 [6:0], position of each bit of the data D[31:0] in a range from 0 bits to 63 bits, and outputs the shifted data as the data RL[95:1]. That is, in the SIMD mode, the bit range of the data RH that is output by the shift circuit 20a and the bit range of the data RL that is output by the shift circuit 20b do not overlap.

With respect to the uppermost case within the brackets at the lower part of FIG. 7, when the shift amount signal SAH is "00 h", the shift amount signal SAH1 is also set to "00 h" (right shift by 0 bits), and the data D[63:32] is output as data R[191:160]. When the shift amount signal SAL is "25 h", the shift amount signal SAL1 is set to "65 h" (right shift by 101 bits), and the data D[31:0] is output as data R[58:27].

With respect to the central case within the brackets at the lower part of FIG. 7, when the shift amount signal SAH is "3 Fh", the shift amount signal SAH1 is also set to "3 Fh" (right shift by 63 bits), and the data D[63:32] is output as data R[128:97]. When the shift amount signal SAL is "00 h", the shift amount signal SAL1 is set to "40 h" (right shift by 64 bits), and the data D[31:0] is output as data R[95:64].

With respect to the lowermost case within the brackets at the lower part of FIG. 7, when the shift amount signal SAH is "10 h" the shift amount signal SAH1 is also set to "10 h" (right shift by 16 bits), and the data D[63:32] is output as data R[175:144]. When the shift amount signal SAL is "3 Fh", the shift amount signal SAL1 is set to "7 Fh" (right shift by 127 bits), and the data D[31:0] output as data R[32:1].

In this way, in the SIMD mode, the data D[63:32] is output to a range of data R[191:97] and the data D[31:0] is output to a range of data R[95:1]. Hence, even when the shift amount signal SAH[6:0] and the shift amount signal SAL [6:0], which are illustrated in FIG. 1, are set independently from each other, it is possible to prevent the data D[63:32] and the data D[31:0] from collision.

Figure 8:
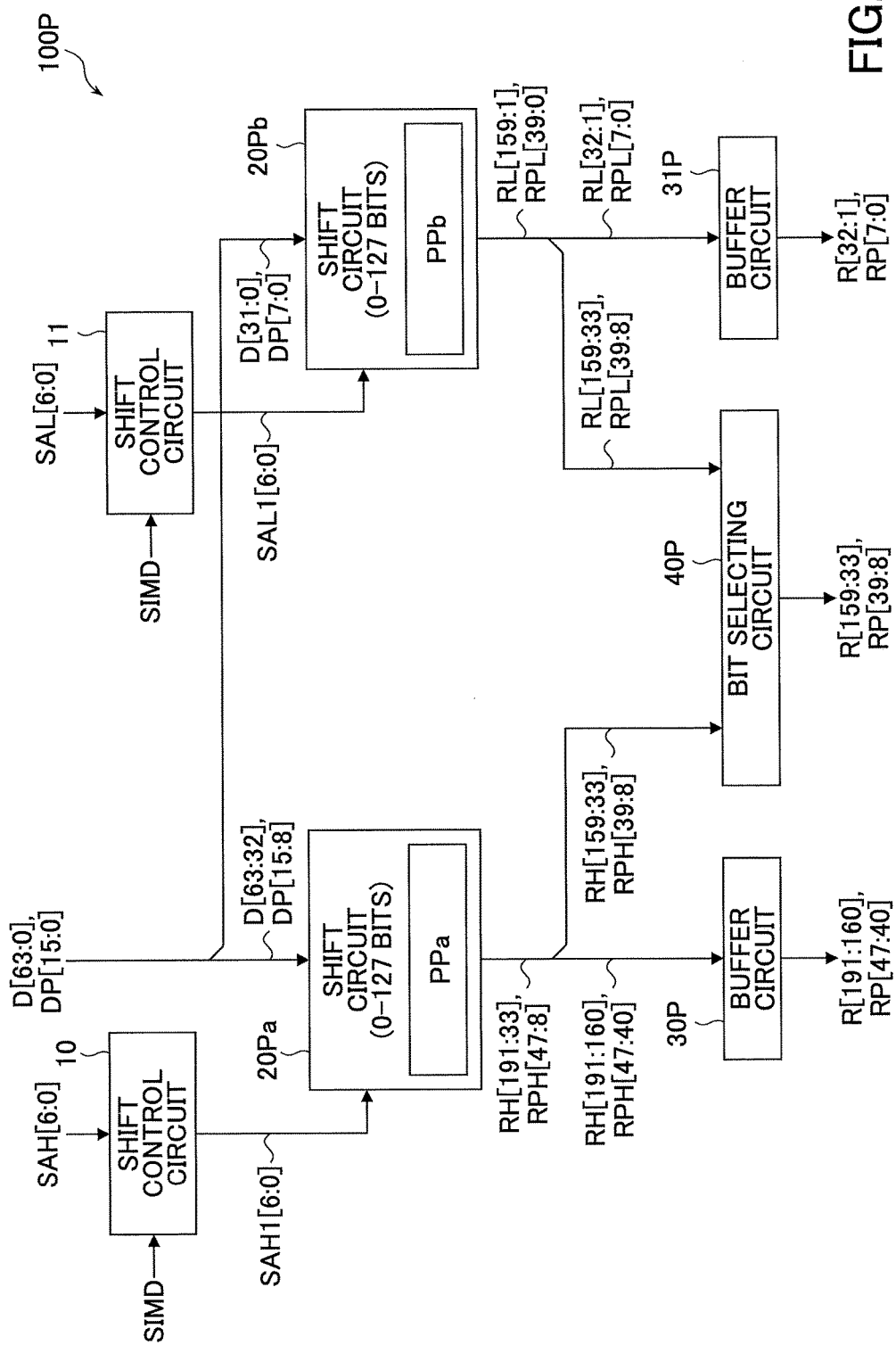
FIG. 8 is diagram illustrating an example of a case in which parity predictors that predict parity bits are built in the shift operation circuit, which is illustrated in FIG. 1.

FIG. 8 illustrates an example of a case in which parity predictors that predict parity bits are built in the shift operation circuit 100, which is illustrated in FIG. 1. In FIG. 8, the same reference numerals are given to elements the same as the elements in FIG. 1 and their detailed descriptions are omitted as appropriate.

A shift operation circuit 100P that includes parity predictors PPa and PPb includes shift circuits 20Pa and 20Pb instead of the shift circuits 20a and 20b, which are illustrated in FIG. 1. Further, the shift operation circuit 100P includes buffer circuits 30R and 31R instead of the buffer circuits 30 and 31, which are illustrated in FIG. 1. Further, the shift operation circuit 100P includes a bit selecting circuit 40P instead of the bit selecting circuit 40, which is illustrated in FIG. 1. The shift operation circuit 100P receives data D[63:0] and parity bits DP[15:0], and detects an error in the data D[63:0]. Each bit of the parity bits DP[15:0] is appended per 4 bits of the data D[63:0].

The parity predictors PPa and PPb are respectively mounted within the shift circuits 20Pa and 20Pb. Each of the parity predictors PPa and PPb includes an exclusive OR circuit that calculates a parity bit DP for each 4-bit data D. The parity bits DP are calculated, in the shift circuits 20Pa and 20Pb, for a plurality of respective stages for sequentially shifting data. Hence, the respective parity predictors PPa and PPb account for several tens of percent of the sizes of the respective shift circuits 20Pa and 20Pb.

The shift circuit 20Pa shifts, in accordance with the shift amount signal SAH1[6:0], the bit positions of the data D[63:32] to output data RH[191:33] and parity bits RPH [47:8]. Each bit of the parity bits RPH[47:8] is added per 4 bits of the data RH[191:33]. The shift circuit 20Pb shifts, in accordance with the shift amount signal SAL1[6:0], the bit positions of the data D[31:0] to output data RL[159:1] and parity bits RPL[39:0]. Each bit of the parity bits RPL[39:0] is added per 4 bits of the data RL[159:1].

By generating parity bits every time the shift circuit 20Pa shifts the data D[63:32], the parity predictor PPa of the shift circuit 20Pa outputs the parity bit RPH[47:8] together with the output of the data RH[191:33]. Similarly, by generating parity bits every time the shift circuit 20Pb shifts data D[31:0], the parity predictor PPb of the shift circuit 20Pb outputs the parity bits RPL[39:0] together with the output of the data RL[159:1]. That is, the parity predictor PPa can predict the parity bits RPH[47:8] without using the data RH[191:33], and the parity predictor PPb can predict the parity bits RPL[39:0] without using the data RL[159:1].

The buffer circuit 30P outputs data RH[191:160] as data R[191:160], and outputs parity bits RPH[47:40] corresponding to the data RH[191:160] as parity bits RP[47:40]. The buffer circuit 31P outputs data RL[32:1] as data R[32:1], and outputs parity bits RPL[7:0] corresponding to the data RL[32:1] as parity bits RP[7.0].

The bit selecting circuit 40P selects valid bits from the data RH[159:33] and the data R[159:33], and outputs the selected bits as data R[159:33]. Further, the bit selecting circuit 40P selects valid bits from parity bits RPH[39:8] and parity bits RPL[39:8], and outputs the selected bits as parity bits RP[39:8]. Note that each bit of the parity bits RP[47:0] is added per 4 bits of the data R[191:1]. The parity bits RP[47:0], which are output together with the data R[191:1], are used, in a circuit to which the data R[191:1] is supplied, to detect an error in the data R[191:1].

FIG. 9 illustrates an example of allocation of data and parity bits in the shift operation circuit 100P, which is illustrated in FIG. 8. Each bit of the parity bits DP[15:0] is added per 4 bits of the data D[63:0]. Each bit of the parity bits RP[47:8] is added per 4 bits of the data RH[191:33]. Each bit of the parity bits RPL[39:0] is added per 4 bits of the data RL[159:1].

Each bit of the parity bits RP[47:0] is added per 4 bits of the data R[191:1]. By inserting parity bits between data bits, a wiring length of a signal for transmitting parity bits can be shortened in the shaft circuits 20Pa and 20Pb relative to a case in which parity bits are not inserted between data bits.

Figure 10:
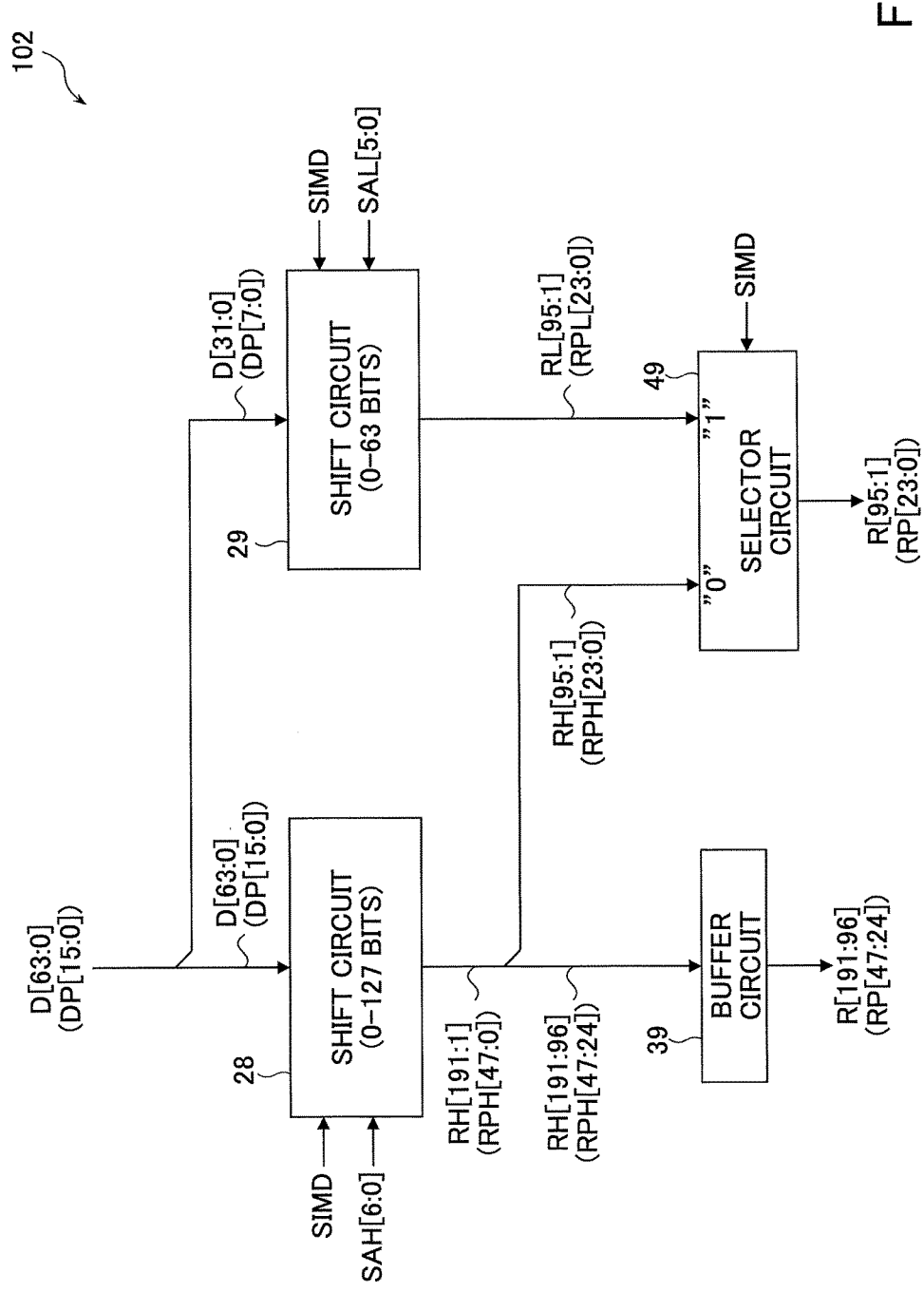
FIG. 10 is a diagram illustrating a shift operation circuit as another example.

FIG. 10 illustrates a shaft operation circuit 102 as another example. Detailed descriptions of elements and functions of the shift operation circuit 102 similar to those of the shift operation circuit 100, which is illustrated in FIG. 1, are omitted as appropriate. The shift operation circuit 102 includes shift circuits 28 and 29, a buffer circuit 39, and a selector circuit 49. Note that in a case where parity predictors are built in the shift operation circuit 102, parity bits DP, RPH, RPL, and RP that are indicated in the brackets are appended. In the following, a case will be described in which the shift operation circuit 102 does not include parity predictors and parity bits DP, RPH, RPL, and RP are not appended.

During the normal mode (SIMD="0"), the shift circuit 28 shifts, in accordance with the value of a shift amount signal SAH[6:0], the bits of 64-bit data D[63:0] from the high-order side to the low-order side, and outputs the shifted data as 191-bit data RH[191:1]. That is, the shift circuit 28 shifts the data D[63:0] to the right by the value of the shift amount signal SAH (which is a value from 0 bits to 127 bits). Further, during the SIMD mode (SIMD="1"), the shift circuit 28 shifts, in accordance with the value of a shift amount signal SAH[5:0], the bits of 32-bit data D[63:32] from the high-order side to the low-order side, and outputs the shifted data as 95-bit data RH[191:97]. That is, the shift circuit 28 shifts the data D[63:32] to the right by the value of the shift amount signal SAH (which is a value from 0 bits to 63 bits).

The shift circuit 29 operates only during the SIMD mode (SIMD="1"), and shifts, in accordance with the value of a shift amount signal SAL[5:0], the bits of 32-bit data D[31:0] from the high-order side to the low-order side, and outputs the shifted data as 95-bit data RH[95:1]. That is, the shift circuit 29 shifts the data D[31:0] to the right by the value of the shift amount signal SAL (which is a value from 0 bits to 63 bits).

The buffer circuit 39 outputs, as data R[191:96], the high-order 96-bit data RH[191:96] within the data RH[191:1] output from the shift circuit 28. The selector circuit 49 selects data RH[95:1] during the normal mode (SIMD="0"), selects data RL[95:1] during the SIMD mode (SIMD="1"), and outputs the selected data as data R[95:1].

In the shift operation circuit 102 illustrated in FIG. 10, the data D[31:0] is supplied to the shift circuits 28 and 29 in an overlapped manner. Because the shift circuit 28 does not shift the data D[31:0] during the SIMD mode, the shift circuit 28 has a wasted circuit that does not operate during the SIMD mode. Further, because the respective shift circuits 28 and 29 are designed independently, the designing period is longer than that of the shift circuits 20a and 20b, which are illustrated in FIG. 1.

Furthermore, the shift circuit 28 operates upon receiving the 64-bit data D[63:0], and the shift circuit 29 operates upon receiving the 32-bit data D[31:0]. Therefore the total number of bits of the input data D is 96 bits. This number is larger than the total number of bits of the data D input to the shift circuits 20a and 20b (64 bits), which are illustrated in FIG. 1, by 32 bits.

In a case where the shift operation circuit 102 includes parity predictors, the total number of bits input to the shift circuits 28 and 29 is 120 bits, and is larger by 40 bits than the total number of bits input to the shift circuits 20Pa and 20Pb of the shift operation circuit 100P (80 bits), which is illustrated in FIG. 8.

For example, a circuit scale of a shift circuit exponentially increases depending on the number of bits of input data. Hence, the circuit scale of the shift operation circuit 102, which is illustrated in FIG. 10, is larger than the circuit scale of the shift operation circuit 100, which is illustrated in FIG. 1. In a case where the shift operation circuit 102 includes parity predictors, the circuit scale of the shift operation circuit 102 is further larger than the circuit scale of the shift operation circuit 100P, which is illustrated in FIG. 8. In other words, according to the shift operation circuit 100 illustrated in FIG. 1, data D[63:32] and data D[31:0] are respectively supplied to the shift circuits 20a and 20b without being overlapped. Hence, it is possible to reduce the size of the shift operation circuit 100 relative to the size of the shift operation circuit 100P, in which part of data D[63:0] is supplied to the plurality of shift circuits 28 and 29 in an overlapped manner.

As described above, according to an embodiment illustrated in FIG. 1 to FIG. 10, the data D[63:32] and D[31:0] whose bits do not overlap can be respectively supplied to the shift circuits 20a and 20b and the shift operation in the normal mode and the shift operation in the SIMD node can be executed. Thereby, the total number of bits of data D supplied to the shift circuits 20a and 20b can be reduced relative to a case in which bits are supplied to a plurality of other shift circuits in an overlapped manner. For example, the total number of bits of data D supplied to the shift circuits 20a and 20b (64 bits) can be two-thirds of the total number of bits of data D supplied to the shift circuits 28 and 29 of the shift operation circuit 102 (96 bits), which is illustrated in FIG. 10. As a result, it is possible to reduce the circuit scale of the shift circuits 20a and 20b to the circuit scale of the shift circuits 28 and 29, and it is possible to reduce the circuit size of the shift operation circuit 100. Further, because the shift circuits 20a and 20b are circuits equal to each other, the designing period can be reduced relative to case of independently designing both the shift circuits 28 and 29, which are illustrated in FIG. 10.

The reference bit positions RL[159] and RH[191] are allocated by shifting the bit width of the divided data D[63:32], and thereby the divided data D[63:32] and D[31:0] can be output, to the output bus R[191:1], as continuous data D[63:0]. In other words, in the normal mode, it is possible to prevent the data D[63:32] and D[31:0] from collision.

By receiving, at the or-circuits OR, the respective bits of the data RH[159:33] and RL[159:33] of which the bit numbers overlap with each other, the bit selecting circuit 40 can select valid data D and output the selected data to the output bus R[159:33] without using a control signal.

In the SIMD mode, the high-order bit SAH1[6] of the shift amount signal SAH1[6:0] and the high-order bit SAL1[6] of the shift amount signal SAL1[6:0] are set to logical values opposite to each other. Thus, even when the shift amount signal SAH[6:0] and the shift amount signal SAL

[6:0] are set independently from each other, it is possible to prevent the data D[63:32] and the data D[31:0] from collision.

Figure 11:
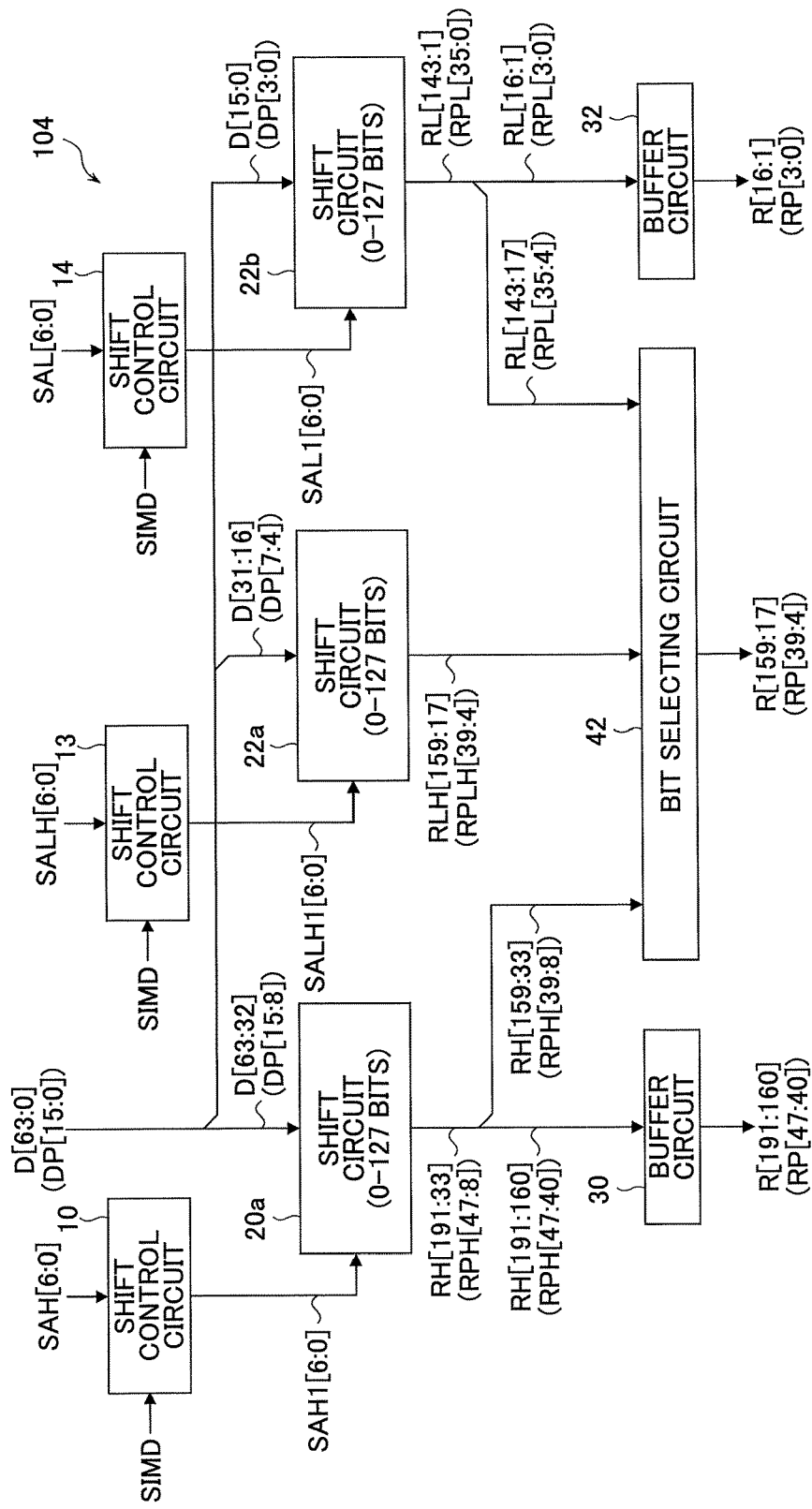
FIG. 11 is a diagram illustrating a shift operation circuit according to another embodiment.

FIG. 11 illustrates a shift operation circuit 104 according to another embodiment. In FIG. 11, the same reference numerals are given to elements the same as or similar to the elements in FIG. 1 and their detailed descriptions are omitted as appropriate. The shift operation circuit 104 according to the embodiment includes shift control circuits 10, 13, and 14, shift circuits 20a, 22a, and 22b, buffer circuits 30, and 32 and a bit selecting circuit 42. Similar to the shift operation circuit 100 that is illustrated in FIG. 1, the shift operation circuit 104 can be mounted on the adder FADD or the multiplier/adder FMA for floating-point numbers of the operation processing. apparatus 200, which is illustrated in FIG. 2.

Note that in a case where parity predictors are built in the shift operation circuit 104, parity bits DP, RPH, RPLH, RPL, and RP that are indicated in the brackets are appended. In the following, a case will be described in which the shift operation circuit 104 does not include parity predictors and parity bits DP, RPH, RPLH, RPL, and RP are not appended. Similar to the shift operation circuit 100 that is illustrated in FIG. 1, the shift operation circuit 104 can be mounted on the adder FADD or the multiplier/adder FMA for floating-point numbers of the operation processing apparatus 200, which is illustrated in FIG. 2.

A circuit configuration and functions of the shift control circuit 10 of FIG. 11 are the same as the circuit configuration and the functions of the shift control circuit 10 illustrated in FIG. 1. The shift control circuit 13 changes logical values of a shift amount signal SALH[6:0] in accordance with a mode signal SIMD, and outputs the changed signal as a shift amount signal SALH1[6:0] The shift control circuit 13 operates in a manner similar to that of the shift control circuit 11, which is illustrated in FIG. 1, except the 2 high-order bits SALH1[6:5] of a shift amount signal SALH1 [6:0] are set to "10" during the SIMD mode.

The shift control circuit 14 operates in a manner similar to that of the shift control circuit 11, which is illustrated in FIG. 1, except the 2 high-order bits SAL1[6:5] of a shift amount signal SAL1[6:0] are set to "11" during the SIMD mode. In the normal mode (SIMD="0"), the shift amount signals SAH[6:0], SALH[6:0], and SAL[6:0] are set to values equal to each other. In the SIMD mode (SIMD ="1"), the shift amount signal SAH[6:0], SALH[6:0], and SAL[6:0] are set independently from each other.

A circuit configuration and functions of the shift circuit 20a of FIG. 11 are the same as the circuit configuration and the functions of the shift circuit 20a that is illustrated in FIG. 1. The shift circuit 22a shifts, in accordance with the value of a shift amount signal SALH1, the bits of 16-bit data D[31:16] within the 64-bit data D[63:0] from the high-order side to the low-order side, and outputs the shifted data to the 143-bit internal bus RLH[159:17]. That is, the shift circuit 22a shifts the data D[31:16] to the right by the value of the shift amount signal SALH1 (which is a value from 0 bits to 127 bits). In the following, the data transmitted to the internal bus RLH[159:17] may be also referred to as the data RLH[159:17]. The shift circuit 22a includes a function to set 127 bits to "0" except for 16 bits output as the data D[31:16] within the 143-bit data RLH[159:17].

The shift circuit 22b shifts, in accordance with the value of a shift amount signal SAL1, the bits of 16-bit data D[15:0] within the 64-bit data D[63:0] from the high-order side to the low-order side, and outputs the shifted data as 143-bit data RL[143:1]. That is, the shift circuit 22b shifts the data D[15:0] to the right by the value of the shift amount signal SAL1 (which is a value from 0 bits to 127 bits). The shift circuit 22b includes a function to set 127 bits to "0" except for 16 bits output as the data D[15:0] within the 143-bit data RL[143:1]. Note that because the shift circuits 22a and 22b are circuits equal to each other and have common circuit data (macro data), it is possible to reduce a designing period of the shift circuits 22a and 22b relative to a case of independently designing the shift circuits 22a and 22b.

A circuit configuration and functions of the buffer circuit 30 of FIG. 11 are the same as the circuit configuration and the functions of the buffer circuit 30 that is illustrated in FIG. 1. The buffer circuit 32 outputs, as data R[16:1], the low-order 16-bit data RL[16:1] within the data RL[143:1] output from the shift circuit 22b.

The bit selecting circuit 42 receives the data RH[159:33], output from the shift circuit 20a, the data RLH[159:17], output from the shift circuit 22a, and the data RL[143:17], output from the shift circuit 22b. The bit selecting circuit 42 selects valid bits from the data RH[159:33], the data RLH [159:17], and the data RL[143:1], and outputs the selected bits as data R[159:17]. Within the data R[159:17], the valid bits are 32 bits at a minimum and 64 bits at a maximum.

Figure 12:
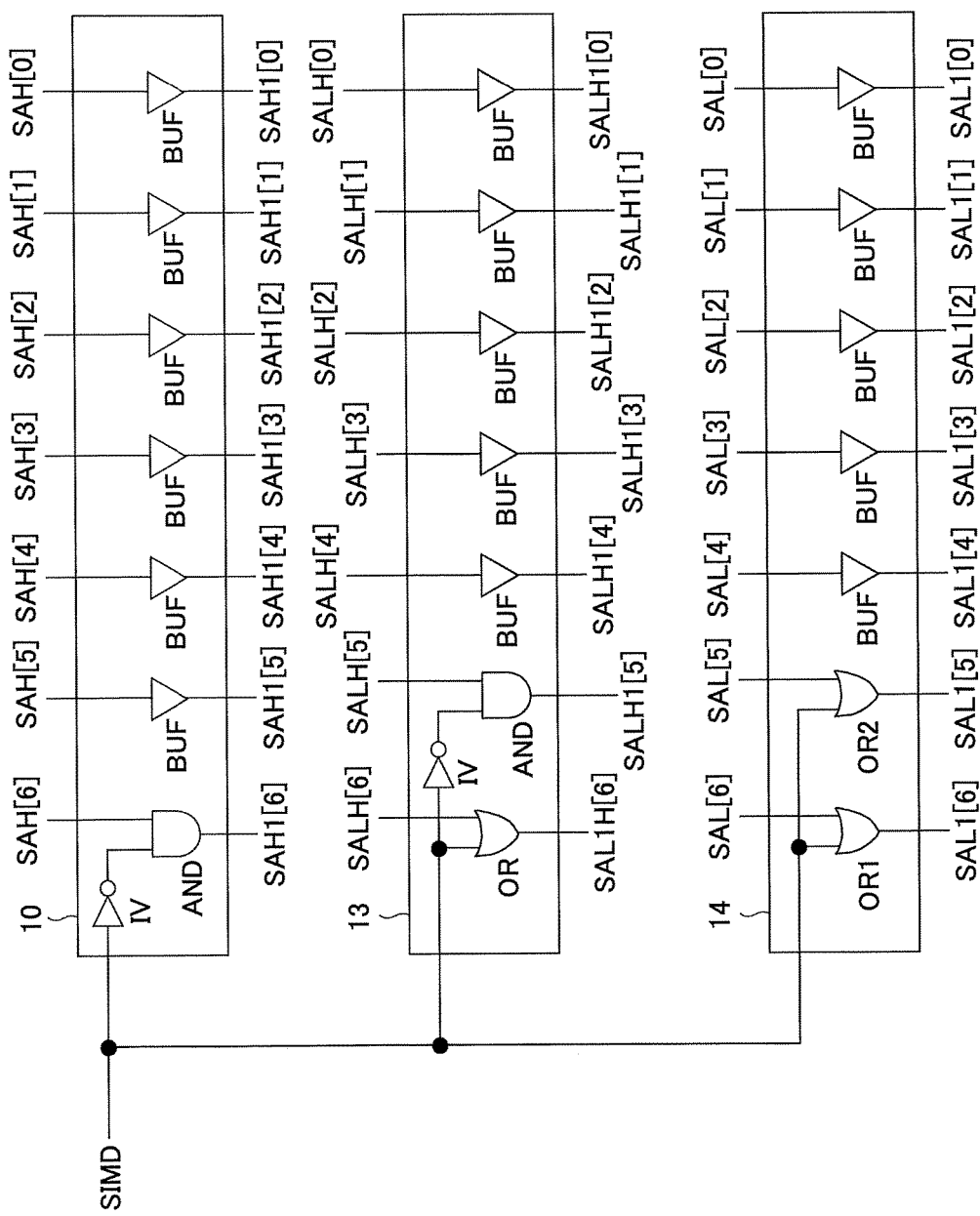
FIG. 12 is a diagram illustrating an example of shift control circuits, which are illustrated in FIG. 11.

FIG. 12 illustrates an example of the shift control circuits 10, 13, and 14, which are illustrated in FIG. 11. A circuit configuration and functions of the shift control circuit 10 of FIG. 12 are the same as the circuit configuration and the functions of the shift control circuit 10 that is illustrated in FIG. 4. That is, during the SIMD mode, the shift control circuit 10 outputs, in accordance with the shift amount signal SAH[5:0], the shift amount signal SAH1[6:0] that represents a shift amount of from 0 bits to 63 bits.

The shift control circuit 13 includes an or-circuit OR that receives a mode signal SIMD, and an and-circuit AND that receives the mode signal SIMD via an inverter IV. Further, the shift control circuit 13 includes a plurality of buffers BUF that output a shift amount signal SALH[4:0] as a shift amount signal SALH1[4:0]. Outputs of the or-circuit OR and the and-circuit AND (SALH1[6:5]) are set to "10" during the SIMD mode. That is, during the SIMD mode, the shift control circuit 13 outputs, in accordance with the shift amount signal SALH[4:0], the shift amount signal SALH1 [6:0] that represents a shift amount of from 64 bits to 95 bits.

The shift control circuit 14 includes off-circuits OR1 and OR2 that receive the mode signal SIMD, and the shift control circuit 14 includes plurality of buffers BUF that output a shift amount signal SAL[4:0] as a shift amount signal SAL1[4:0]. Outputs of the or-circuits OR1 and OR2 (SAL1[6:5]) are set to "11" during the SIMD mode. That is, during the SIMD mode, the shift control circuit 14 outputs, in accordance with the shift amount signal SAL[4:0], the shift amount signal SAL1[6:0] that represents a shift amount of from 96 bits to 127 bits.

Figure 13:
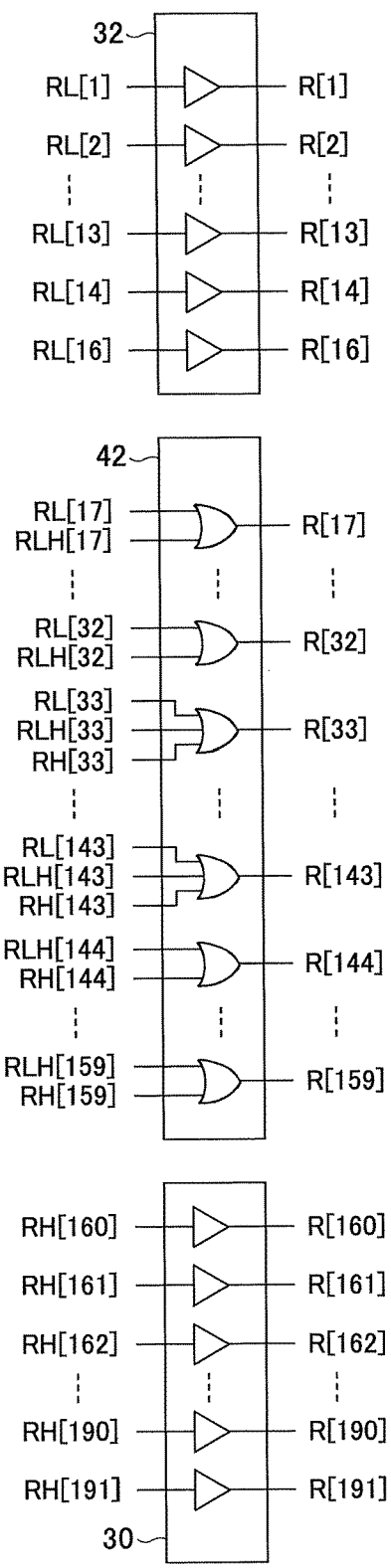
FIG. 13 is a diagram illustrating an example of buffer circuits and a bit selecting circuit, which are illustrated in FIG. 11.

FIG. 13 illustrates an example of the buffer circuits 30 and 32 and the bit selecting circuit 42, which are illustrated FIG. 11. A circuit configuration and functions of the buffer circuit 30 of FIG. 13 are the same as the circuit configuration and the functions of the buffer circuit 30 that is illustrated in FIG. 5. The buffer circuit 32 includes a plurality of buffers BUF that output data RL[16:1] as data R[16:1].

The bit selecting circuit 42 includes a plurality of or-circuits OR each of which has two input units to operate an-or logic of each bit of data RH and RLH corresponding to data R[159:144]. Further, the bit selecting circuit 42 includes a plurality of or-circuits OR each of which has three input units to operate an-or logic of each bit of data RH, RLH, and RLH corresponding to data R[143:33]. Furthermore, the bit selecting circuit 42 includes a plurality of or-circuits OR each of which has two input units to operate an-or logic of each bit of data RLH and RL corresponding to data R[32:17]. That is, for each bit of the data R[159:17], the logical value 1 is set in a case where the respective bit of the data RH[159:33], or the respective of the data RLH[159:33], or the respective of the data RL[143:17] is the logical value 1.

Figure 14:
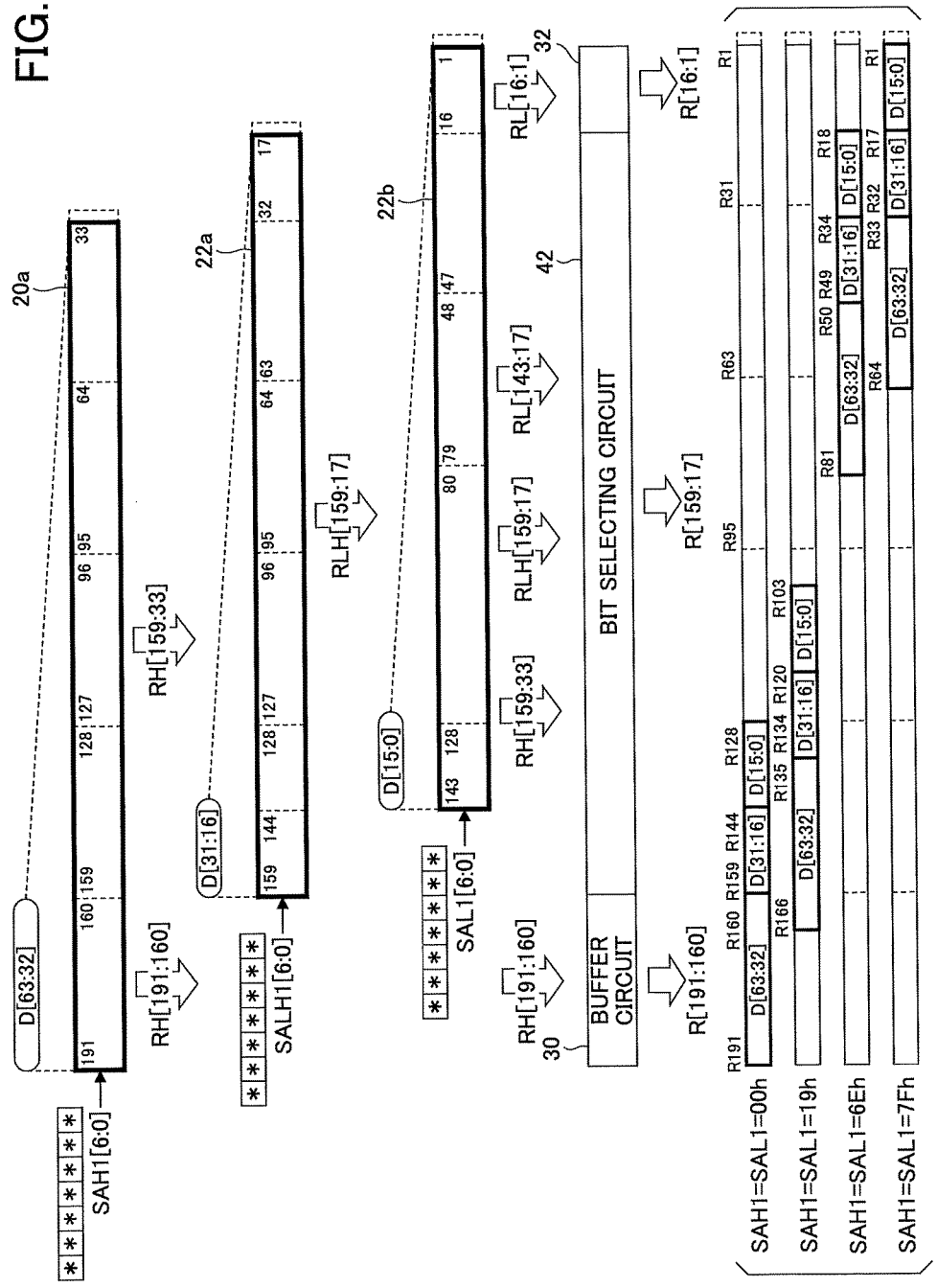
FIG. 14 is a diagram illustrating an example of an operation in the normal mode of the shift operation circuit, which is illustrated in FIG. 11.
Figure 15:
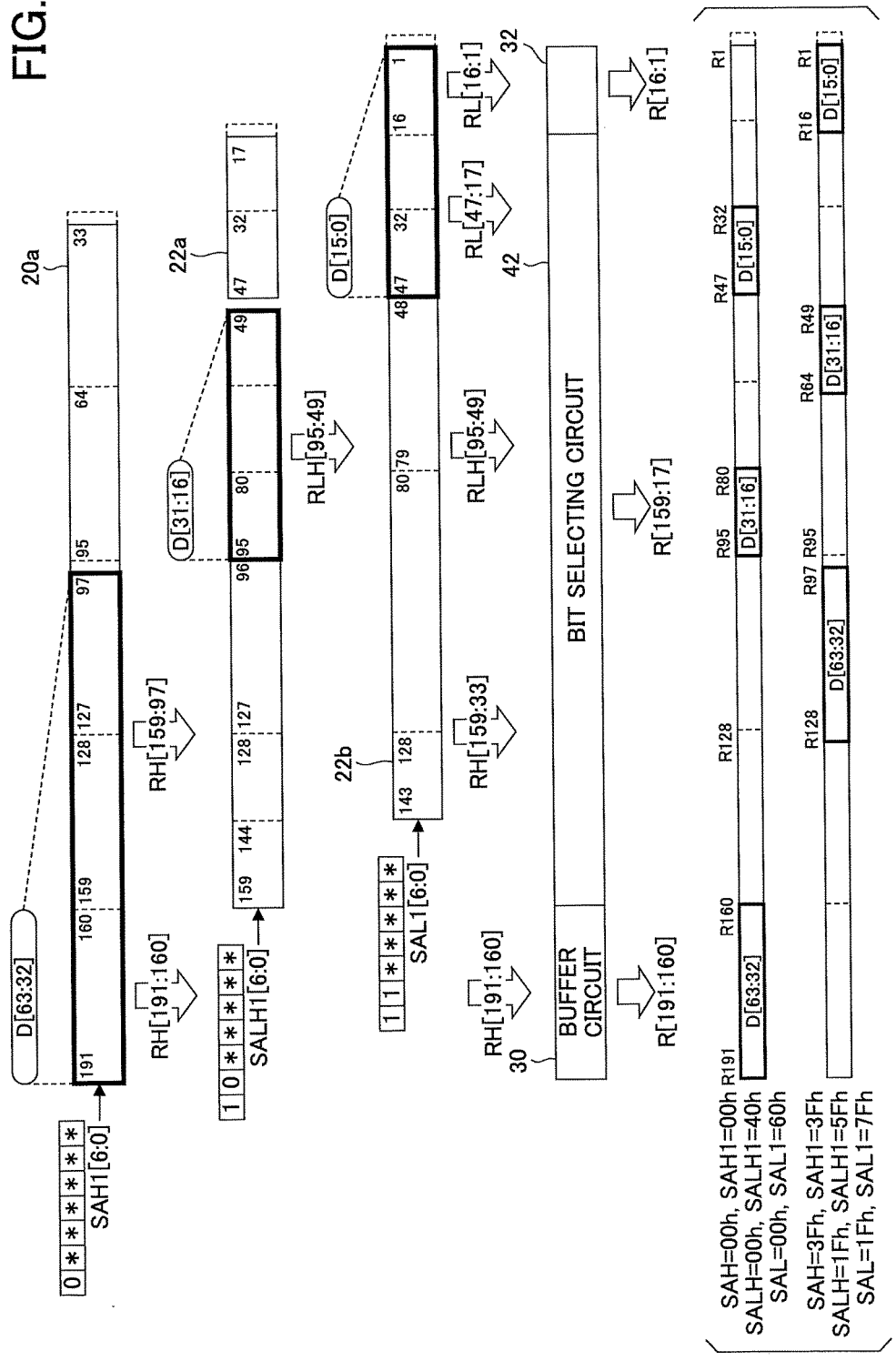
FIG. 15 is a diagram illustrating an example of an operation in the SIMD mode of the shift operation circuit, which is illustrated in FIG. 11.

Each of the shift circuits 20a, 22a, and 20b, which are illustrated in FIG. 11, includes a function to set bits to the logical value 0 except for valid bits. Further, as illustrated in FIG. 14 and FIG. 15, the data D[63:0] is not simultaneously output to the internal buses RH, RLH and RL having same bit numbers. Hence, valid data D is not simultaneously supplied to the plurality of input units of each or-circuit OR of the bit selecting circuit 42. Therefore, by receiving, through the or-circuits OR, the respective bits of the data RH, RLH, and RL of which the bit numbers overlap with each other, the bit electing circuit 42 can select valid data and output the selected data to the output bus R[159:17] without using a control signal.

FIG. 14 illustrates an example of an operation in the normal mode (SIMD="0") of the shift operation circuit 104 which is illustrated in FIG. 11. That is, FIG. 14 illustrates an example of a shift operation method by the shift operation circuit 104. Detailed descriptions for an operation of FIG. 14 similar to that of FIG. 6 are omitted as appropriate.

The operation of the shift circuit 20a the same as the operation in FIG. 6. With reference to the bit RLH[159], the shift circuit 22a shifts, in accordance with the shift amount signal SALH1[6:0], the position of each bit of the data D[31:16] in a range of from 0 bits to 127 bits, and outputs the shifted data as the data RLH[159:17]. With reference to the bit RL[143], the shift circuit 22b shifts, in accordance with the shift amount signal SAL1[6:0], the position of each bit of the data D[15:0] in a range of from 0 bits to 127 bits, and outputs the shifted data as the data RL[143:1].

The bit range of the data RH that is output the shift circuit 20a and the bit range of the data RLH that is output by the shift circuit 22a differ by 32 bits. The bit range of the data RLH that is output by the shift circuit 22a and the bit range of the data RL that is output by the shift circuit 22b differ by 16 bits. Further, in the normal mode (SIMD="0"), the shift amount signals SAH[6:0], SALH[6:0], and SAL[6:0] are set to values equal to each other. Hence, in a shift operation of the data D[63:0], the shift operation circuit 104 can output the data D[63:32], D[31:16], and D[15:0] as the data R without causing the bit numbers of the data RH, RLH, and RL to overlap with each other. Further the shift operation circuit 104 can output the data R making blank bit numbers in data RH, RLH, and RL.

The data R[191:1] illustrated within brackets at the lower part of FIG. 14 indicates an example of bit positions at which data D[63:0] appears in accordance with the shift amount signals SAH1, SALH1, and SAL1. The bit positions at which the data D[63:0] appears are similar to those in FIG. 6.

FIG. 15 illustrates an example of an operation in the SIMD mode (SIMD="1") of the shift operation circuit 104, which is, illustrated in FIG. 11. That is, FIG. 15 illustrates another example of the shift operation method by the shift operation circuit 104. Detailed descriptions for an operation of FIG. 15 similar to that of FIG. 7 are omitted as appropriate. Note that in the SIMD mode, the shift amount signals SAH1[6:0], SALH1[6:0], and SAL1[6:0], which are illustrated in FIG. 11, are set independently from each other.

In the SIMD mode, the most significant bit SAH1[6] of the shift amount signal SAH1[6:0] is fixed to "0", and and the high-order bits SALH1[6:5] of the shift amount signal SALH1[6:0] are fixed to "10". Further, the high-order bits SAL1[6:5] of the shift amount signal SAL1[6:0] are fixed to "11". That is, in the SIMD mode, the 2 high-order bits of the shift amount signals SAH1, SALH1, and SAL1 are set to logical, values different from each other.

The shift circuit 20a operates in a manner similar to that in FIG. 7. That is, with reference to the bit RH[191], the shift circuit 20a shifts, in accordance with the shift amount signal SAH1[6:0], the position of each bit of the data D[63:32] in range of from 0 bits to 63 bits, and outputs the shifted data as the data RH[191:97].

With reference to the bit RLH[159], the shift amount signal 22a shifts in accordance with the shift amount signal SALH1[6:0], the position of each bit of the data D[31:16] in a range of from 64 bits to 95 bits, and outputs the shifted data the data RLH[95:49]. With reference to the bit RL[143], the shift circuit 22b shifts, in accordance with the shift amount signal SAL1[6:0], the position of each bit of the 16-bit data D[15:0] in a range of from 96 bits to 127 bits, and outputs the shifted data as the data RL[47:1]. That is, in the SIMD mode, the bit range of the data RH that is output by the shift circuit 20a, the bit range of the data RLH that is output by the shift circuits 22a, and the bit range of the data RL that is output by the shift circuit, 22b do not overlap.

With respect to the upper case within the brackets at the lower part of FIG. 15, when the shift amount signal SAH is "00 h", the shift amount signal SAH1 is also set to "00 h" (right shift by 0 bits), and the data D[63:32] is output as data R[191:160]. When the shift amount signal SALH is "00 h", the shift amount signal SALH1 is set to "40 h" (right shift by 64 bits), and the data D[31:16] is output as data R[95:80]. When the shift amount signal SAL is "00 h", the shift amount signal SALH1 is set to "60 h" (fight shift by 96 bits), and the data D[15:0] is output as data R[47:23].

With respect to the lower within the brackets at the lower part of FIG. 15, when the shift amount signal SAH is "3 Fh" the shift amount signal SAH1 is also set to "3 Fh" (right shift by 63 bits), and the data D[63:32] is output as data R[128:97]. When the shift amount signal SALH is "1 Fh", the shift amount signal SALH1 is set to "5 Fh" (right shift by 95 bits), and the data D[31:16] is output as data R[64:49]. When the shift amount signal SAL is "1 Fh", the shift amount signal SALH1 is set to "7 Fh" (right shift by 127 bits), and the data D[15:0] is output as data R[16:1].

In this way, in the SIMD mode, the data D[63:32] is output to a range of data R[191:97], the data D[31:16] is output to a range of data R[95:49], and the data D[15:0] is output to a range of data R[47:1]. Hence, even when the shift amount signals [6:0], and SALH[6:0] which are illustrated in FIG. 11, are set independently from each other, it is possible to prevent the data D[63:32]; D[31:16] and D[15:0] from collision.

As described above, it is also possible to obtain, from the embodiment illustrated in FIG. 11 to FIG. 15, effects similar to those the embodiments illustrated in FIG. 1. to FIG. 10. For example, it is possible to reduce the circuit size of the shift operation circuit 104 relative to the circuit size of another shift operation circuit including a plurality of shift circuits to which bits are supplied in an overlapped manner.

The reference bit positions of the internal buses RH, RLH, and RL, which are respectively coupled to the three shift circuits 20a, 22a, and 22b, are shifted by the bit width of divided data D, and thereby data D can be prevented from collision in the normal mode. By receiving, through the or-circuits OR each of which has two or three input units, the respective bits of the data RH, RLH, and RL of which the bit numbers overlap with each other, the bit selecting circuit 42 can select valid data D without using a control signal. In the SIMD mode, by making logical values of the high-order two bits of the shift amount signals SAH1, SALH1, and SAL1 different from each other, it is possible to prevent the data D[63:32], the data D[31:0], and the data D[15:0] from collision.

Figure 16:
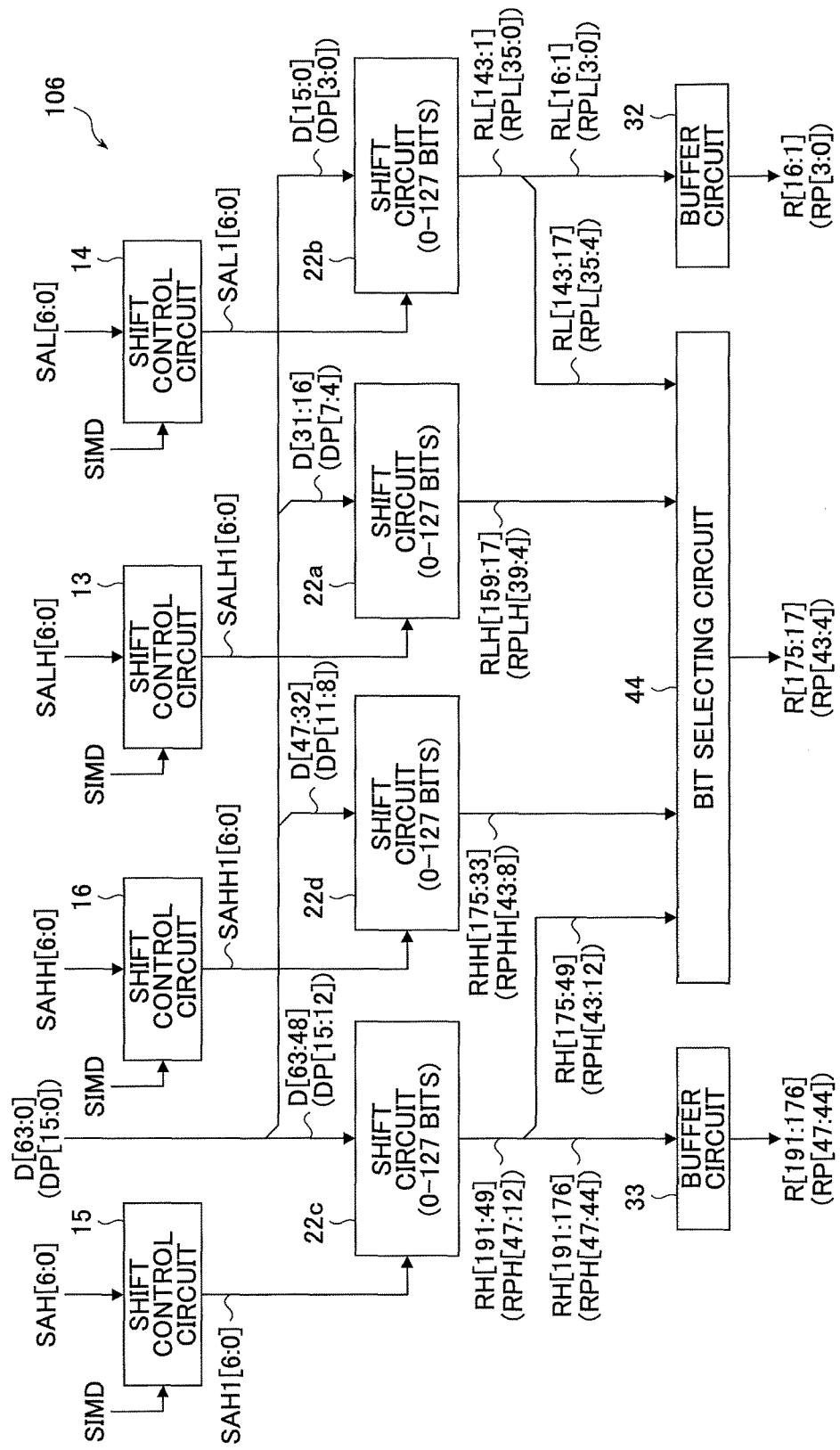
FIG. 16 is a diagram illustrating a shift operation circuit according to another embodiment.

FIG. 16 illustrates a shift operation circuit 106 according to another embodiment. In FIG. 16, the same reference numerals are given to elements the same as or similar to the elements in FIG. 1 and FIG. 11 and their detailed descriptions are omitted as appropriate. The shift operation circuit 106 according to the embodiment includes shift control circuits 15, 16, 13, and 14, shift circuits 22c, 22d, 22a, and 22b, buffer circuits 33, and 32, and a bit selecting circuit 44.

Similar to the shift operation circuit 100 that is illustrated in FIG. 1, the shift operation circuit 106 can be mounted on the adder FADD or the multiplier/adder FMA for floating-point numbers of the operation processing apparatus 200, which is illustrated in FIG. 2. In this case, in a SIMD operation, data (operands) divided into four are used to execute the operation in parallel.

Note that in a case where parity predictors are built in the shift operation circuit 106, parity bits DP, RPH, RPRH, RPLH, RPL, and RP that are indicated in the brackets are appended. In the following, a case will be described in which the shift operation circuit 106 does not include parity predictors and parity bits parity bits DP, RPH, RPHH, RPLH, RPL, and RP are not appended.

The shift control circuit 15 changes logical values of a shift amount signal SAH[6:0] in accordance with a mode signal SIMD, and outputs the changed signal as a shift amount signal SAH1[6:0]. The shift control circuit 16 changes logical values of a shift amount signal SAHH[6:0] in accordance with the mode signal SIMD, and outputs the changed signal as a shift amount signal SAHH1[6:0]. A circuit configuration and functions of the shift control circuit 13 of FIG. 16 are the same as the circuit configuration and the functions of the shift control circuit 13 that is illustrated in FIG. 11, and a circuit configuration and functions of the shift control circuit 14 of FIG. 16 are the same as the circuit configuration and the functions of the shift control circuit 14 that is illustrated in FIG. 11.

The shift circuits 22c, 22d, 22a, and 22b have circuit configurations the same as those of the shift circuits 22a and 22b, which are illustrated in FIG. 11. Hence, it is possible to have common circuit data (macro data) in the shift circuits 22c, 22d, 22a, and 22b, and it is possible to reduce the designing period of the shift circuits 22c, 22d, 22a, and 22b relative to a case of independently designing the shift circuits 22c, 22d, 22a, and 22b. An operation of the shift circuit 22a of FIG. 16 is the same as the operation of the shift circuit 22a that illustrated in FIG. 11, and an operation of the shift circuit 22b of FIG. 16 is the same as the operation of the shift circuit 22b that is illustrated in FIG. 11.

The shift circuit 22c shifts, in accordance with the value of a shift amount signal SAH1, the bits of 16-bit data D[63:48] within the 64-bit data D[63:0] from the high-order side to the low-order side, and outputs the shifted data to the 143-bit internal bus RH[191:49]. That is, the shift circuit 22c shifts the data D[63:48] to the right by the value of the shift amount signal SAH1 (which is a value from 0 bits to 127 bits).

The shift circuit 22d shifts, in accordance with the value of a shift amount signal SAHH1, the bits of 16-bit data D[47:32] within the 64-bit data D[63:0] from the high-order side to the low-order side, and output the shifted data to the 143-bit internal bus RHH[175:33]. That is, the shift circuit 22d shifts the data D[47:32] to the right by the value of the shift amount signal SAHH1 (which is a value from 0 bits to 127 bits). In the following, data transmitted to the internal bus RHH[175:33] may be also referred to as the data RHH[175:33].

A circuit configuration and functions of the buffer circuit 32 of FIG. 16 are the same as the circuit configuration and the functions of the buffer circuit 32 that is illustrated in FIG. 11. The buffer circuit 33 has a circuit configuration the same as that of the buffer circuit 32. The buffer circuit 33 outputs, as data R[191:176], the high-order 16-bit data RH[191:176] within the data RH[191:49] output from the shift circuit 22c.

The bit selecting circuit 44 receives the data RH[175:49], output from the shift circuit 22c, and the data RHH[175:33], output from the shift circuit 22d. Further, the bit selecting circuit 44 receives the data RLH[159:17], output from the shift circuit 22a, and the data RL[143:17], output from the shift circuit 22b. The bit selecting circuit 44 selects valid bits from the data RH[175:49], the data RHH[175:33], the data RLH[159:17], and the data RL[143:17], and outputs the selected bits as data R[175:17]. Within the data R[175:17], the valid bits are 48 bits at a minimum and 64 bits at a maximum.

Figure 17:
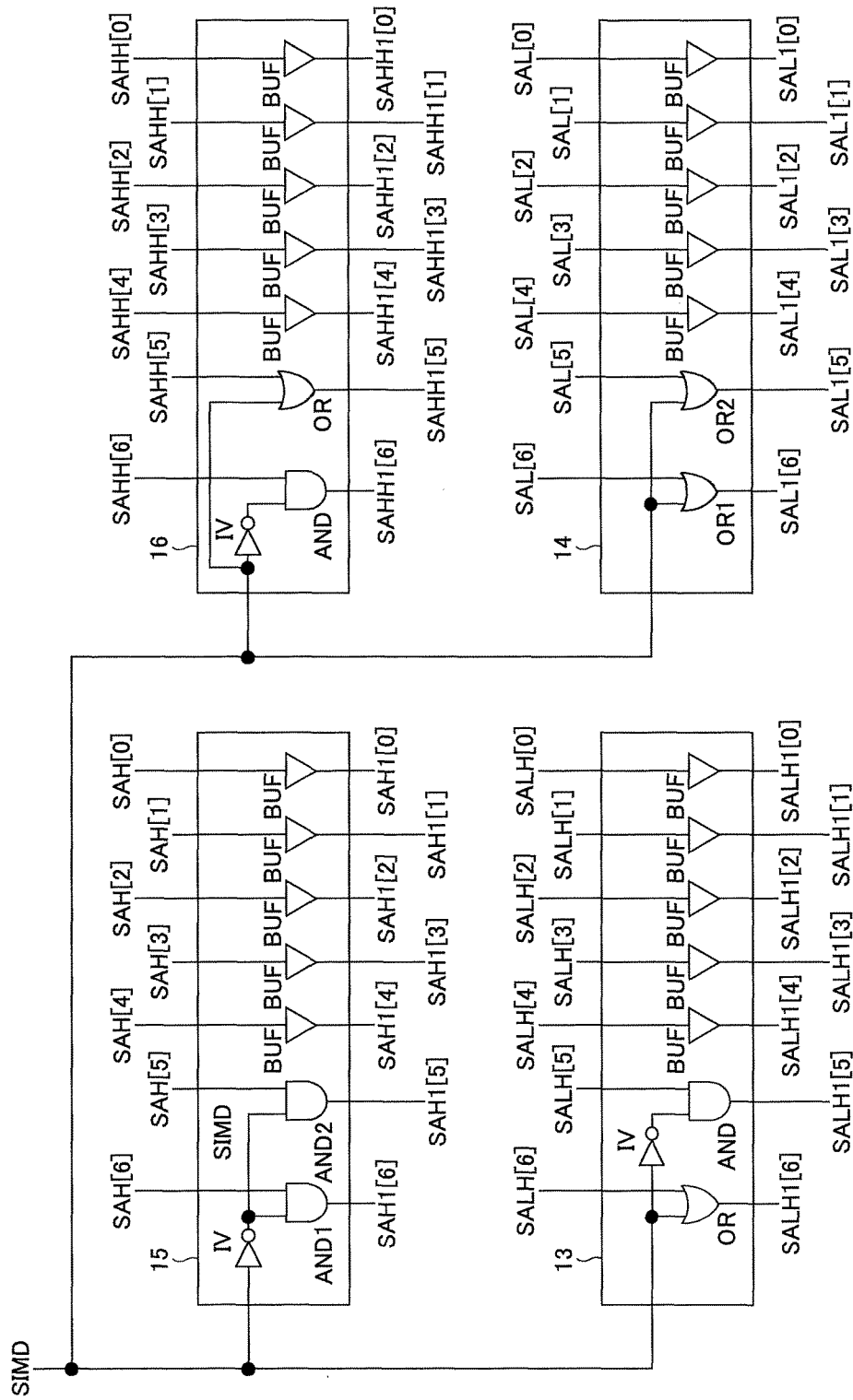
FIG. 17 is a diagram illustrating an example of shift control circuits, which are illustrated in FIG. 16.

FIG. 17 illustrates an example of the shift control circuits 15, 16, 13, and 14, which are illustrated in FIG. 16. A circuit configuration and functions of the shift control circuit 13 of FIG. 17 are the same as the circuit configuration and the functions of the shift control circuit 13 that is illustrated in FIG. 11, and a circuit configuration and functions of the shift control circuit 14 of FIG. 17 are same as the circuit configuration and the functions of the shift control circuit 14 that is illustrated in FIG. 11.

The shift control circuit 15 includes and-circuits AND1 and AND2 that receive a mode signal SIMD via an inverter IV, and a plurality of buffers BUF that output a shift amount signal SAH[4:0] as a shift amount signal SAH1[4:0]. Outputs of the and-circuit AND1 and AND2 (SAH1[6:5]) are set to "00" during the SIMD mode. That is, during the SIMD mode, the shift control circuit 15 outputs, in accordance with the shift amount signal SAH[4:0], the shift amount signal SAH1[6:0] that represents a shift amount of from 0 bits to 31 bits.

The shift control circuit 16 includes an and-circuit AND that receives the mode signal SIMD via an inverter and an or-circuit OR that receives the mode signal SIMD. Further, the shift control circuit 16 includes a plurality of buffers BUF that output a shift amount signal SAHH[4:0] as a shift amount signal SAHH1[4:0]. Outputs of the and-circuit AND and the or-circuit OR (SAHH1[6:5]) are set to "01" during the SIMD mode. That is, during the SIMD mode, the shift control circuit 16 outputs, in accordance with the shift amount signal SAHH[4:0], the shift amount signal SAHH1[6:0] that represents a shift amount of from 32 bits to 54 bits.

Figure 18:
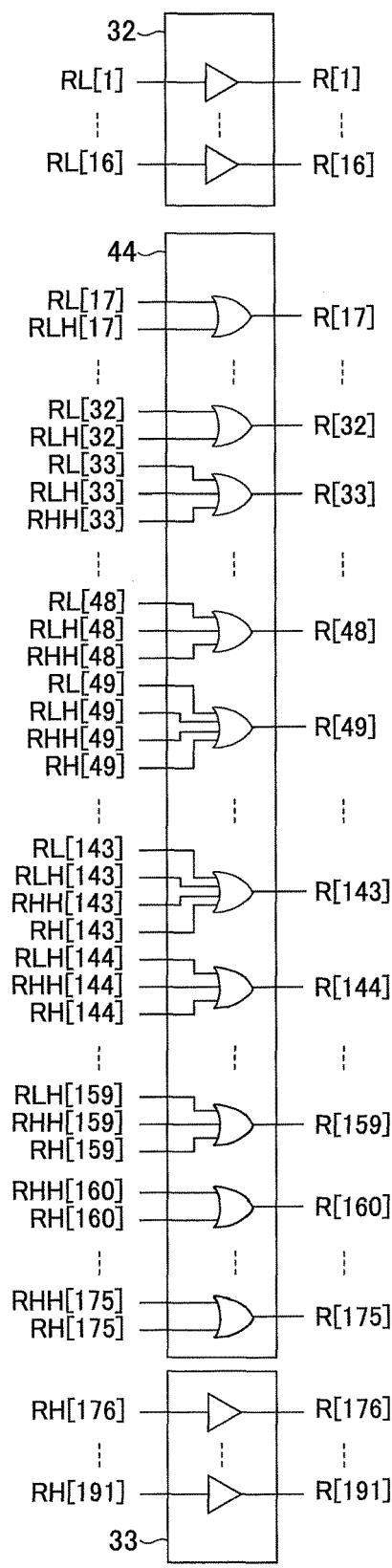
FIG. 18 is a diagram illustrating an example of buffer circuits and a bit selecting circuit, which are illustrated in FIG. 16.

FIG. 18 illustrates an example of the buffer circuits 33 and 32 and the bit selecting circuit 44, which are illustrated in FIG. 16. A circuit configuration and functions of the buffer circuit 32 of FIG. 18 are the same as the circuit configuration and the functions of the buffer circuit 32 that is illustrated in FIG. 13. The buffer circuit 33 includes a plurality of buffers BUF that output data RH[191:176] as data R[191:176].

The bit selecting circuit 44 includes a plurality of or-circuits OR each of which has two input units to operate an-or logic of each bit of data RH and RHH corresponding to data R[175:160]. Further, the bit selecting circuit 44 includes a plurality of or-circuits OR each of which has three input units to operate an-or logic of each bit of data RH, RHH, and RLH corresponding to data R[159:144]. Furthermore, the bit selecting circuit 44 includes a plurality of or-circuits OR each of which has four input units to operate an-or logic of each bit of data RH, RHH, RLH, and RL corresponding to data R[143:49].

Further, the bit selecting circuit 44 includes a plurality of or-circuits OR each of which has three input units to operate an-or logic of each bit of data RHH, RLH, and RL corresponding to data R[48:33]. Furthermore, the bit selecting circuit 44 includes a plurality of or-circuits OR each of which has two input units to operate an-or logic of each bit of data RLH and RL corresponding to data R[32:17]. That, is, for each bit of the data R[175:17], the logical value 1 is set in a case where the respective of the data RH[175:49], the respective of the data RHH[175:33], each bit of the data RLH[159:17], or respective of the data RL[143:17] is the logical value 1.

Figure 19:
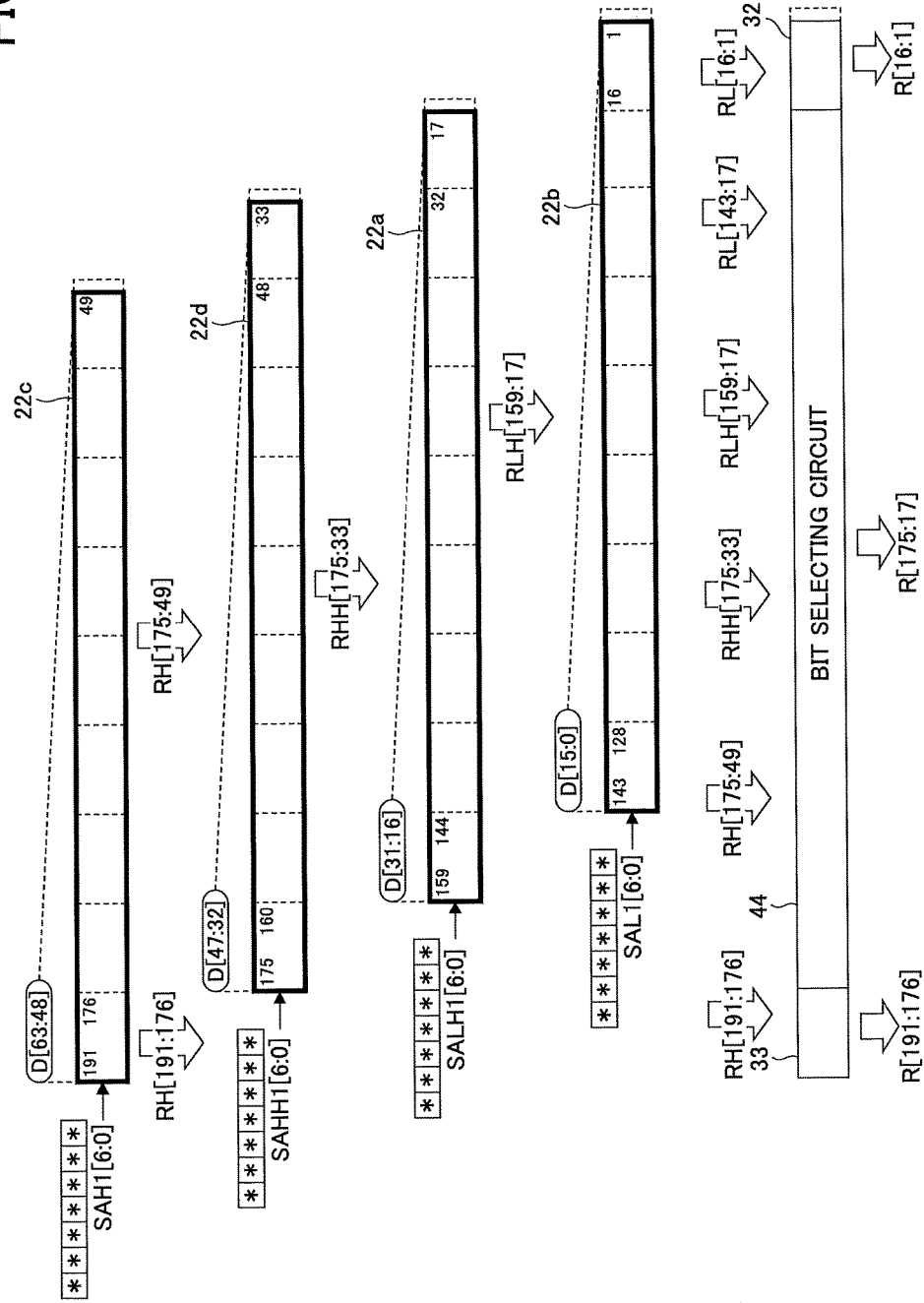
FIG. 19 is a diagram illustrating an example of an operation in the normal mode of the shift operation circuit, which is illustrated in FIG. 16.
Figure 20:
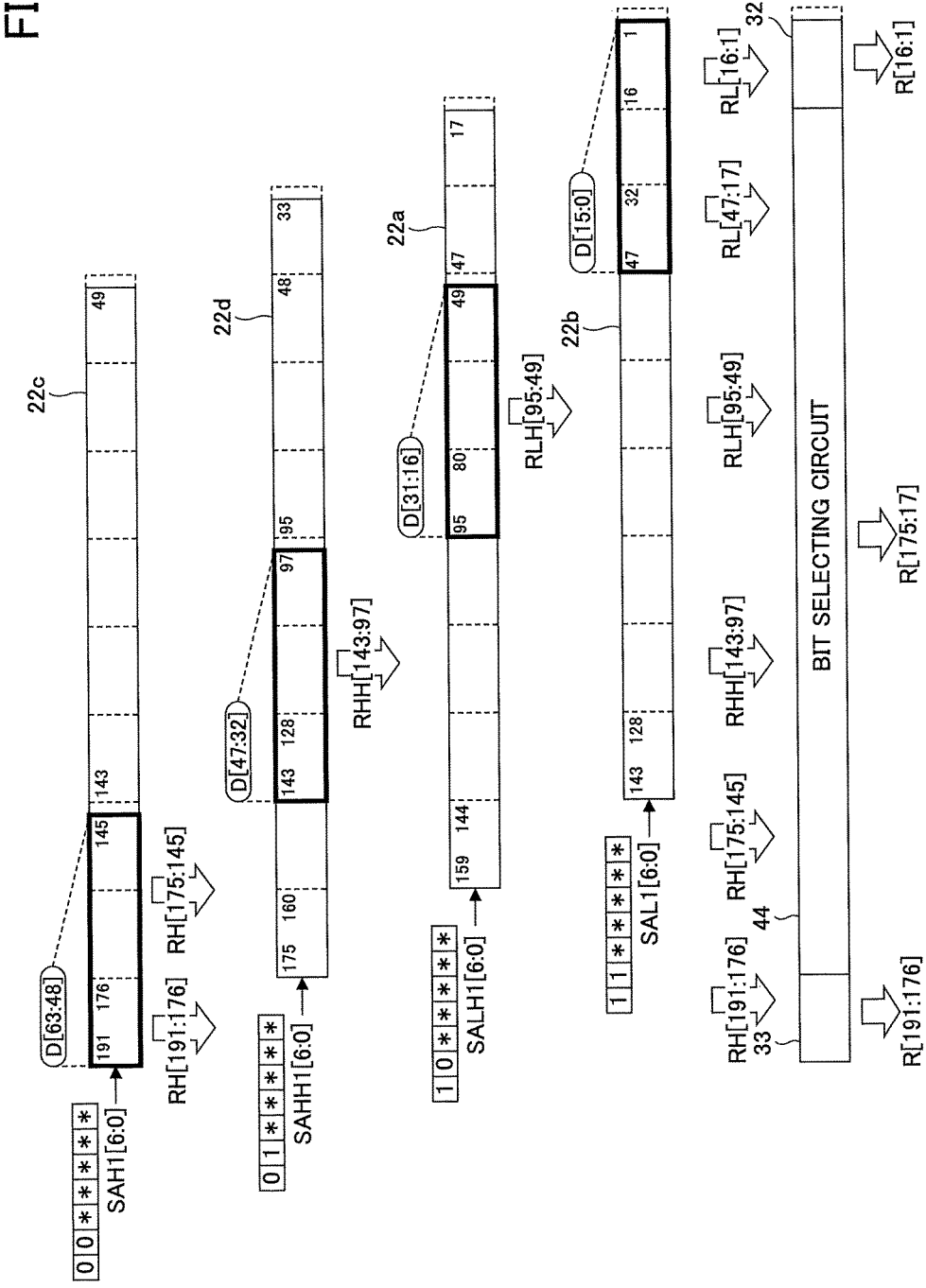
FIG. 20 is a diagram illustrating an example of an operation in the SIMD mode of the shift operation circuit, which is illustrated in FIG. 16.

Each of the shift circuits 22*c*, 22*d*, 22*a*, and 20*b*, which are illustrated in FIG. 16, includes a function to set bits to the logical value 0 except for valid bits. Further, as illustrated in FIG. 19 and FIG. 20, the data D[63:0] is not simultaneously output to the internal buses RH, RHH, RLH, and RL having same bit numbers. Hence, valid data D is not simultaneously supplied to a plurality of input units of each or-circuit OR of the bit selecting circuit 44. Therefore, by receiving, through the or-circuits OR, the respective bits of the data RH, RLH, and RL of which the bit numbers overlap with each other, the bit selecting circuit 44 can select valid data and output the selected data to the output bus R[175:17] without using a control signal.

FIG. 19 illustrates an example of an operation in the normal mode (SIMD="0") of the shift operation circuit 106, which is illustrated in FIG. 16. That is, FIG. 19 illustrates an example of a shift operation method by the shift operation circuit 106. Detailed descriptions for an operation of FIG. 19 similar to that of FIG. 6 and FIG. 14 are omitted as appropriate.

With reference to the bit RH[191], the shift circuit 22*c* shifts, in accordance the shift amount signal SAH[6:0], the position of each bit of the data D[63:48] in a range of from 0 bits to 127 bits, and outputs the shifted data as the data RH[191:49]. With reference to the bit RH[175], the shift circuit 22*d* shifts, in accordance with the shift amount signal SAHH1[6:0], the position of each bit of the data D[47:32] in a range of from 0 bits to 127 bits, and outputs the shifted data as the data RHH[175:33]. Operations of the shift circuits 22*a* and 22*b* are the same as those in FIG. 14.

The bit range of the data RH that is output by the shift circuit 22*c* and the bit range of the data RHH that is output by the shift circuit 22*d* differ by 16 bits. The bit range of the data RHH that is output by the shift circuit 22*d* and the bit range of the data RLH that is output by the shift circuit 22*a* differ by 16 bits. The bit range of the data RLH that is output by the shift circuit 22*a* and the bit range of the data RL that is output by the shift circuit 22*b* differ by 16 bits. Further, in the normal mode (SIMD="0"), the shift amount signals SAH[6:0], SAHH[6:0], and SALH[6:0] are set to values equal to each other. Hence, in a shift operation, the shift operation circuit 106 can output the data D[63:48], D[47:32], [31:16], and D[15:0] as the data R without causing the bit numbers of the data RH, RHH, RLH, and RL to overlap with each other. Further, the shift operation circuit 106 can output the data R without making blank bit numbers of data RH, RHH, RLH, and RL.

FIG. 20 illustrates an example of an operation in the SIMD mode (SIMD="1") of the shift operation circuit 106, which is illustrated in FIG. 16. That is, FIG. 20 illustrates another example of the shift operation method by the shift operation circuit 106. Detailed descriptions for an operation of FIG. 20 similar to that of FIG. 7 and FIG. 15 are omitted as appropriate. Note that in the SIMD mode, the shift amount signals SAH1[6:0], SAHH1[6:0], SALH1[6:0], and SAL1[6:0], which are illustrated in FIG. 16, are set independently from each other.

In the SIMD mode, the high-order bits SAH1[6:5] of the shift amount signal SAH1[6:0] are fixed to "00" and the high-order bits SAHH1[6:5] of the shift amount signal SAHH1[6:0] are fixed to "01". Further, the high-order bits SALH1[6:5] of the shift amount signal SALH1[6:0] are fixed to "10", and the high-order bits SAL1[6:5] of the shift amount signal SAL1[6:0] are fixed to "11". That is, in the SIMD mode, the 2 high-order bits of the shift amount signals SAH1, SAHH1, SALH1, and SAL1 are set to logical values different from each other.

With reference to the bit RH[191], the shift circuit 22*c* shifts, in accordance with the shift amount signal SAH1[6:0], the position of each bit of the data D[63:48] in a range of from 0 bits to 31 bits, and outputs the shifted data as the data RH[191:145]. With reference to the bit RH[175], the shift circuit 22*d* shifts, in accordance with the shift amount signal SAHH1[6:0], the position of each bit of the data D[47:32] in a range of from 32 bits to 63 bits, and outputs the shifted data as the data RH[143:97]. Operations of the shift circuits 22*a* and 22*b* of FIG. 20 are the same as the operations of the shift circuits 22*a* and 22*b* that are illustrated in FIG. 15.

As illustrated in FIG. 20, in the SIMD mode, the data D[63:48] is output to a range of data R[191:145], and the data D[47:32] is output to a range of data R[143:97]. The data D[31:16] is output to a range of data R[95:49], and the data D[15:0] is output to a range of data R[47:1]. That is, the bit ranges of the data RH, RHH, RLH, and RL that are output by the shift circuits 22*c*, 22*d*, 22*a*, and 22*b* do not overlap with each other. Hence, even when the shift amount signals SAH, SAHH, SALH, and SAL are set independently from each other, it is possible to prevent the data D[63:48], D[47:32], D[31:16], and D[15:0] from collision.

Figure 21:
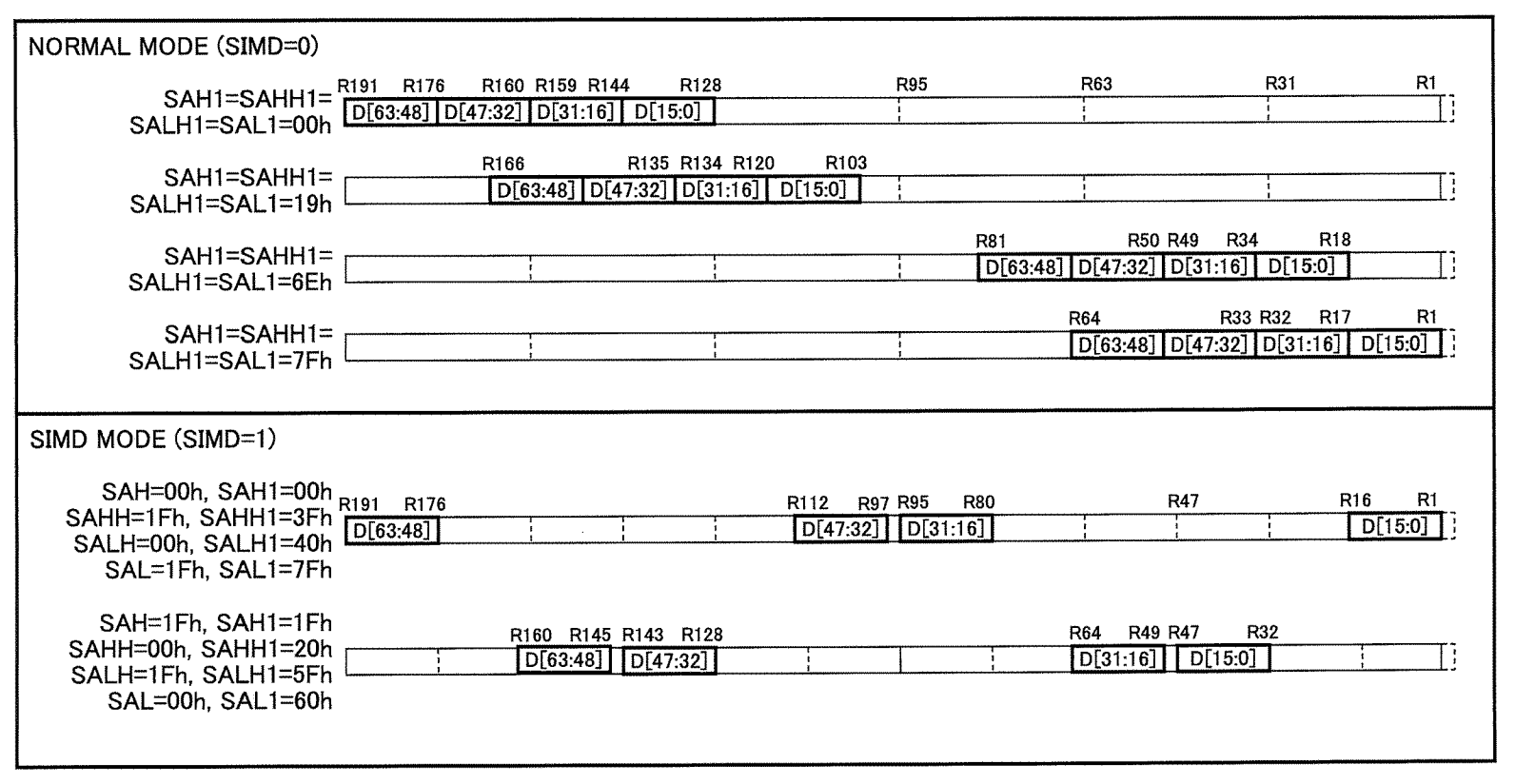

FIG. 21 illustrates an example of a shift operation of the shift operation circuit 106, which is illustrated in FIG. 16. In the normal mode, for example, when the shift amount signals SAH, SAHH, SALH, and SAL are "00 h", the shift amount signals SAH1, SAHH1, SALH1, and SAL1 are also set to "00 h" (right shift by 0 bits). In this case, the data D[63:48], D[47:32], D[31:16], and D[15:0] are output as R[191:128]. When the shift amount signals SAH, SAHH, SALH, and SAL are "19 h", the shift amount signals SAH1, SAHH1, SALH1, and SAL1 are also set to "19 h" (right shift by 25 bits). In this case, the data D[63:48], D[47:32], D[31:16], and D[15:0] are output as R[166:103].

When the shift amount signals SAH, SAHH, SALH, and SAL are "6 Eh", the shift amount signals SAH1, SAHH1, SALH1, and SAL1 are also set to "6 Eh" (right shift by 110 bits). In this case, the data D[63:48], D[47:32], D[31:16], and D[15:0] are output as R[81:18]. When the shift amount signals SAH, SAHH, SALH, and SAL are "7 Fh", the shift amount signals SAH1, SAHH1, SALH1, and SAL1 are also set to "7 Fh" (right shift by 127 bit). In this case, the data D[63:48], D[47:32], D[31:16], and D[15:0] are output as R[64:1].

Conversely, in the SIMD mode, for example, shift amount signals SAH, SAHH, SALH, and SAL are set to "00 h", "1

Fh", "00 h", and "1 Fh". In this case, the shift amount signals SAH1, SAHH1, SALH1, and SAL1 are set to "00 h", "3 Fh", "40 h", and "7 Fh". In this case, the data D[63:48] is output as R[191:176], and the data D[47:32] is output as R[112:97]. In this case, the data D[31:16] is output as R[95:80], and the data D[15:0] is output as R[16:1].

Further, in the SIMD mode, for example, the shift amount signals SAH, SAHH, SALH, and SAL are set to "1 Fh", "00 h", "1 Fh", and "00 h". In this case, the shift amount signals SAH1, SAHH1, SALH1, and SAL1 are set to "1 Fh", "20 h", "5 Fh", and "60 h". In this case, the data D[63:48] is output as R[60:145], and the data D[47:32] is output as R[143:128]. In this case, the data D[31:16] is output as R[64:49], and the data D[15:0] is output as R[47:32].

Note that by making the mode signal SIMD illustrated in FIG. 16 into 2 bits, the operation processing apparatus 200, in which the shift operation circuit 106 is mounted on an arithmetic unit, can execute both a SIMD operation for 32-bit data (divided into two) and a SIMD operation for 16-bit data (divided into four). In this case, during a first SIMD mode for executing a two-divisional SIMD operation, the shift control circuits 15 and 16 set the most significant bits SAH1[6] and SAHH1[6] of shift amount signals SAH1 [6:0] and SAHH1[6:0] to the logical value 0. The shift control circuits 13 and 14 set the most significant bits SALH1[6] and SAL1[6] of shift amount signals SALH1[6: 0] and SAL1[6:0] to the logical value 1. Thereby, the shift operation circuit 106 operates in a manner similar to that in FIG. 7. A second SIMD mode for executing a four-divisional SIMD operation is the same as that in FIG. 20.

As described above, it is also possible to obtain, from the embodiment illustrated FIG. 16 to FIG. 21, effects similar to those of the embodiments illustrated in FIG. 1 to FIG. 15. For example, it is possible to reduce the circuit size of the shift operation circuit 106 relative to the circuit size of another shift operation circuit including a plurality of shift circuits to which bits are supplied in an overlapped manner.

The reference bit positions of the internal buses RH, RHH, RLH, and RL, which are respectively coupled to the four shift circuits 22c, 22d, 22a, and 22b, are shifted by the bit width of divided data D, and thereby data D can be prevented from collision in the normal mode. By receiving through the or-circuits OR each of which has two input units, three input units or four input units, the respective bits of the data RH, RHH, RLH, and RL of which the bit numbers overlap with each other, the bit selecting circuit 44 can select valid data D without using a control signal. In the SIMD mode, by making logical values of the high-order two bits of the shift amount signals SAH1, SAHH1, SALH1, and SAL1 different from each other, it is possible to prevent the data D[63:48], D[47:32], D[31:16], and D[15:0] from collision. Further, according to the embodiment illustrated in FIG. 16 to FIG. 21, by making the mode signal SIMD into 2 bits, the shift operation circuit 106 can execute a two-divisional SIMD operation or a four-divisional SIMD operation.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:

1. A shift operation circuit comprising:
a plurality of shift circuits each of which is coupled to a corresponding internal bus that is one of a plurality of internal buses having a bit width greater than a bit width of input data, a part of bit numbers of the plurality of internal buses overlapping, each of the plurality of shift circuits being configured to receive corresponding divided data that is one of a plurality of sets of divided data obtained by dividing the input data and to receive a corresponding shift amount signal that is one of a plurality of shift amount signals, each of the plurality of shift circuits being configured to output the corresponding divided data to a range shifted based on a shift amount represented by the corresponding shift amount signal from a reference bit position in the corresponding internal bus;
a shift control circuit configured to receive, during a first mode, each of a plurality of shift amount signals whose shift amounts are common and to output, as the corresponding shift amount signal, the received Plurality of shift amount signal to each of the plurality of shift circuits, and the shift control circuit being configured to receive, during a second mode, a shift amount signal for each of the plurality of shift circuits, convert the received shift amount signal into a corresponding shift amount signal that represents a shift range whose bit numbers do not overlap in the plurality of internal buses, and to output the corresponding shift amount signal to each of the plurality of shift circuits; and
a bit selecting circuit configured to select valid corresponding divided data from bits whose bit numbers overlap in the plurality of internal buses and configured to output the selected corresponding divided data to an output bus.

2. The shift operation circuit according to claim 1, wherein the reference bit position in each of the plurality of respective internal buses is allocated by shifting a bit width of the corresponding divided data.

3. The shift operation circuit according to claim 1, wherein each of the plurality of shift circuits includes a function to set one or more bits, which do not output the corresponding divided data in the corresponding internal bus, to a logical value 0, and
wherein the bit selecting circuit includes a plurality of or-circuits having input units coupled to bits whose bit numbers overlap in the plurality of internal buses.

4. The shift operation circuit according to claim 1, wherein during the second mode, the shift control circuit sets a predetermined number of high-order bits in the corresponding shift amount signal output to each of the plurality of shift circuits to logical values different from each other.

5. The shift operation circuit according to claim 1, further comprising:
a buffer circuit configured to output, to the output bus, corresponding divided data output to bits whose bit numbers do got overlap in the plurality of internal buses.

6. A shift operation method for a shift operation circuit including a plurality of shift circuits each of which is coupled to a corresponding internal bus that is one of a plurality of internal buses having a bit width greater than a bit width of input data, a part of bit numbers of the plurality of internal buses overlapping, the shift operation method comprising:

receiving, by each of the plurality of shift circuits, corresponding divided data that is one of a plurality of sets of divided data obtained by dividing the input data:

receiving, by each of the plurality of shift circuits, a corresponding shift amount signal that is one of a plurality of shift amount signals;

outputting, by each of the plurality of shift circuits, the corresponding divided data to a range shifted based on a shift amount represented by the corresponding shift amount signal from a reference bit position in the corresponding internal bus;

receiving, by a shift control circuit included in the shift operation circuit, during a first mode, each of a plurality of shift amount signals whose shift amounts are common and outputting, as the corresponding shift amount signal, the received plurality of shift amount signals to each of the plurality of shift circuits;

receiving, by the shift control circuit, during a second mode, a shift amount signal for each of the plurality of shift circuits, converts the received shift amount signal into a corresponding shift amount signal that represents a shift range whose bit numbers do not overlap in the plurality of internal buses, and outputting the corresponding shift amount signal to each of the plurality of shift circuits;

selecting, by a bit selecting circuit included in the shift operation circuit, valid corresponding divided data from bits whose bit numbers overlap in the plurality of internal buses; and outputting, by the bit selecting circuit, the selected corresponding divided data to an output bus.

* * * * *